US012587204B2

(12) United States Patent
Wu

(10) Patent No.: US 12,587,204 B2
(45) Date of Patent: Mar. 24, 2026

(54) CHANNEL SELECTION CIRCUIT, ANALOG-TO-DIGITAL CONVERTER AND SYSTEM-ON-CHIP

(71) Applicant: GIGADEVICE SEMICONDUCTOR INC., Haidian (CN)

(72) Inventor: Lipeng Wu, Haidian (CN)

(73) Assignee: GIGADEVICE SEMICONDUCTOR INC., Haidian (CN)

( * ) Notice: Subject to any disclaimer, the term of this patent is extended or adjusted under 35 U.S.C. 154(b) by 212 days.

(21) Appl. No.: 18/656,732

(22) Filed: May 7, 2024

(65) Prior Publication Data

US 2024/0380410 A1 Nov. 14, 2024

(30) Foreign Application Priority Data

May 8, 2023 (CN) .......................... 202310511424.3

(51) Int. Cl.
*H03M 1/10* (2006.01)
*H03K 19/20* (2006.01)
*H03M 1/18* (2006.01)
(52) U.S. Cl.
CPC .............. *H03M 1/18* (2013.01); *H03K 19/20* (2013.01)
(58) Field of Classification Search
CPC ........ H03M 1/18; H03M 1/12; H03M 1/1205; H03M 1/21; H03K 19/20; H03K 19/215
USPC ................................................. 341/155, 159
See application file for complete search history.

(56) References Cited

U.S. PATENT DOCUMENTS

| | | | |
|---|---|---|---|
| 6,567,024 B1 | 5/2003 | Ishikawa | |
| 2003/0227311 A1 | 12/2003 | Ranganathan | |
| 2009/0073020 A1* | 3/2009 | Shimizu | H03M 1/002 |
| | | | 330/252 |
| 2010/0182179 A1* | 7/2010 | Chou | H03M 1/002 |
| | | | 341/142 |
| 2020/0042076 A1* | 2/2020 | Idgunji | G06F 1/26 |

OTHER PUBLICATIONS

Fang et al., A 5-GS/s 10-b 76-mW Time-Interleaved SAR ADC in 28 nm Cmos, IEEE Transactions on Circuits and Systems I: Regular Papers ( vol. 64, Issue: 7, Jul. 2017).
Xin et al., A 750-nW 1-MHz 9-tap analog finite impulse response filter for wireless senor network chip, Microelectronics Journal, vol. 71, Jan. 2018, pp. 30-36.

* cited by examiner

*Primary Examiner* — Peguy Jean Pierre
(74) *Attorney, Agent, or Firm* — Ziegler IP Law Group, LLC.

(57) ABSTRACT

A channel selection circuit, an analog-to-digital converter (ADC) and a system-on-chip (SoC) are provided. During a sampling phase of an ADC circuit, a substrate voltage of a MOS switch in a selected channel is set to a voltage of analog input signal to which the channel is coupled. This eliminates the body-bias effect of the MOS switch, greatly improving linearity of the channel selection circuit and enabling the ADC to provide the required high speed and high-accuracy and exhibit excellent performance even at a low power supply voltage. Moreover, harmonic distortion around the dominant frequency can be suppressed, enabling the ADC to provide the required high accuracy (e.g., a 16-bit or even higher resolution).

20 Claims, 13 Drawing Sheets

| fs MSPs | fin KR z | Corne r Temp. | RON/Ω, VDD=3.3V | | | | | | RON/Ω, VDD=1.8V | | | | | |
|---|---|---|---|---|---|---|---|---|---|---|---|---|---|---|
| | | | Design of Fig.2 | | | Design of Present application | | | Design of Fig.2 | | | Design of Present application | | |
| | | | Min | Max | Max-Min | Min | Max | Max-Min | Min | Max | Max-Min | Min | Max | Max-Min |
| 4 | 148 | TT 27 | 16.65 | 26.99 | 10.34 | 21.99 | 22.37 | 0.38 | | | | | | |
| | | TT -40 | 13.86 | 21.59 | 7.73 | 16.73 | 16.98 | 0.33 | 21.8 | 285.7 | 263.9 | 28.13 | 29.07 | 0.94 |
| | | TT 125 | 19.45 | 36.84 | 17.39 | 30.43 | 31.25 | 0.82 | 27.4 | 138.6 | 101.2 | 32.14 | 34.05 | 1.91 |
| | | SS -40 | 14.65 | 25.23 | 10.57 | 17.73 | 17.97 | 0.25 | 23.68 | 177.5 | 175.22 | 31.42 | 32.5 | 1.08 |
| | | SS 125 | 20.92 | 41.8 | 20.88 | 31.71 | 32.53 | 0.82 | 33.83 | 299 | 175.17 | 56.99 | 59.02 | 2.03 |
| | | FF -40 | 13.15 | 18.86 | 5.71 | 15.9 | 16.1 | 0.2 | 20.11 | 101.9 | 81.79 | 25.35 | 26.21 | 0.86 |
| | | FF 125 | 19.09 | 33.04 | 13.95 | 29.36 | 30.15 | 0.89 | 29.93 | 89.19 | 59.26 | 48.01 | 49.88 | 1.87 |
| | | SNFP -40 | 13.29 | 21.89 | 8.6 | 17.52 | 17.77 | 0.25 | 29.42 | 368.7 | 288.28 | 30.72 | 31.77 | 1.05 |
| | | SNFP 125 | 12.3 | 37.77 | 25.47 | 31.37 | 32.28 | 0.91 | 30.6 | 133 | 102.4 | 35.92 | 37.99 | 2.07 |
| | | FNSP -40 | 14.15 | 22.02 | 7.87 | 16.06 | 16.27 | 0.21 | 21.85 | 230.4 | 228.55 | 25.87 | 26.74 | 0.87 |
| | | FNSP 125 | 20.59 | 35.92 | 15.33 | 29.59 | 30.35 | 0.78 | 33.35 | 122.7 | 89.35 | 48.83 | 50.64 | 1.81 |

CHANNEL SELECTION CIRCUIT, ANALOG-TO-DIGITAL CONVERTER AND SYSTEM-ON-CHIP

CROSS-REFERENCE TO RELATED APPLICATION

This application claims the priority of Chinese patent application number 202310511424.3, filed on May 8, 2023 and entitled "CHANNEL SELECTION CIRCUIT, ANALOG-TO-DIGITAL CONVERTER AND SYSTEM-ON-CHIP", the entire contents of which are incorporated herein by reference.

TECHNICAL FIELD

The present invention relates to the field of integrated circuits and, in particular, to a channel selection circuit, an analog-to-digital converter (ADC) and a system-on-chip (SoC).

BACKGROUND

Serving as bridges from analog signals to digital signals, analog-to-digital converters (ADCs) are indispensable to system-on-chips (SoCs). As the accuracy of ADCs usually determines the performance of such systems, their importance is self-evident. Although SoC designs typically require conversion of multiple (M) analog signals to their digital representations, ADCs can convert only one analog signal each time. Therefore, an ADC is often provided with a front-end channel selection circuit for enabling the ADC to handle multiple analog signals. The channel selection circuit only selects one of the analog signals each time and provides it as an input to the subsequent circuit of the ADC.

FIG. 1 is a block diagram of an ADC with a channel selection circuit 10. In addition to the channel selection circuit 10, the ADC further includes an ADC circuit 11 coupled to the channel selection circuit 10. According to the value of a channel selection signal SEL<k:1>, the channel selection circuit 10 selects one of M analog input signals VIN<m:1> and outputs the selected analog signal to an input terminal of the N-bit ADC circuit 11, as an input signal ADC_input for the ADC circuit 11. In response, the ADC circuit 11 converts the input signal ADC_input from the channel selection circuit 10 into a digital signal Dout<N−1:0>. In this design, complementary metal-oxide-semiconductor (CMOS) switches each consisting of parallel-connected NMOS and PMOS switches are usually chosen as switches for channels in the channel selection circuit 10. However, due to the use of the MOS transistors as the channel switches, this design suffers from various deficiencies associated with the MOS transistors, including the body-bias effect and a threshold voltage varying with an input voltage VIN. Consequently, it is difficult for the ADC to provide the required high accuracy, low power consumption and other performance aspects.

SUMMARY OF THE INVENTION

The present invention provides a channel selection circuit serving as a front-end circuit of an analog-to-digital conversion (ADC) circuit, the channel selection circuit comprising:

a switch control circuit, configured to generate first switch control signals based on channel selection signals during a sampling phase of the ADC circuit;

a MOS switch channel circuit comprising an input terminal coupled to m analog input signals and an output terminal coupled to an input terminal of the ADC circuit, wherein the MOS switch channel circuit comprises m channels each having a MOS switch, wherein a gate of each MOS switch is coupled to a corresponding one of the first switch control signals; and a substrate potential control circuit comprising: input terminals coupled to the m analog input signals and the first switch control signals; and output terminals coupled to substrates of the MOS switches in the MOS switch channel circuit, wherein the substrate potential control circuit is configured to set, during the sampling phase of the ADC circuit, a substrate voltage of the MOS switch in a selected channel to a voltage of the analog input signal to which the selected channel is coupled.

Based on the same inventive concept, the present invention further provides an ADC comprising an ADC circuit and a channel selection circuit as defined above, the channel selection circuit coupled to m analog input signals and configured to select one of the m analog input signals each time and output it to an input terminal of the ADC circuit, the ADC circuit configured to convert the analog input signal selected by the channel selection circuit into a digital signal.

Based on the same inventive concept, the present invention further provides SoC comprising an ADC as defined above.

BRIEF DESCRIPTION OF THE DRAWINGS

Those of ordinary skill in the art would appreciate that the accompanying drawings are provided to facilitate a better understanding of the present invention and do not limit the scope thereof, in which.

DETAILED DESCRIPTION

Figure 1:
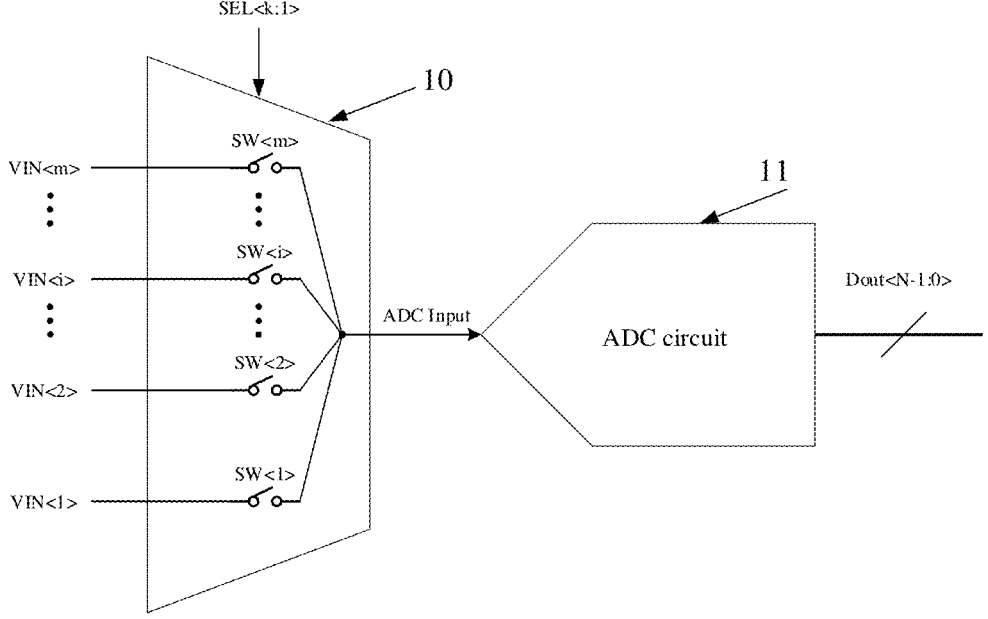
FIG. 1 is a block diagram of an ADC with a channel selection circuit.

The following description sets forth numerous specific details in order to provide a more thorough understanding of the present invention. However, it will be apparent to those skilled in the art that the present invention can be practiced without one or more of these specific details. In other instances, well-known technical features have not been described in order to avoid unnecessarily obscuring of the invention. It is understood that the invention may be embodied in many different forms and should not be construed as being limited to the embodiments set forth below. Rather, these embodiments are provided so that this disclosure illustrates the scope of the invention to those skilled in the art. In the drawings, the same reference numerals refer to the same elements throughout. It will be understood that when an element is referred to as being "connected to" or "coupled to" another element, it can be directly connected or coupled to the other element, or intervening elements may also be present. In contrast, when an element is referred to as being "directly connected to" another element, there are no intervening elements. As used herein, the singular forms "a", "an" and "the" are intended to include the plural forms as well, unless the context clearly indicates otherwise. It will be further understood that the term "comprising" specifies the presence of stated features, steps, operations, elements, and/or components, but do not preclude the presence or addition of one or more other features, steps, operations, elements, components, and/or groups thereof. As used herein, the term "and/or" includes any and all combinations of the associated listed items.

Figure 2:
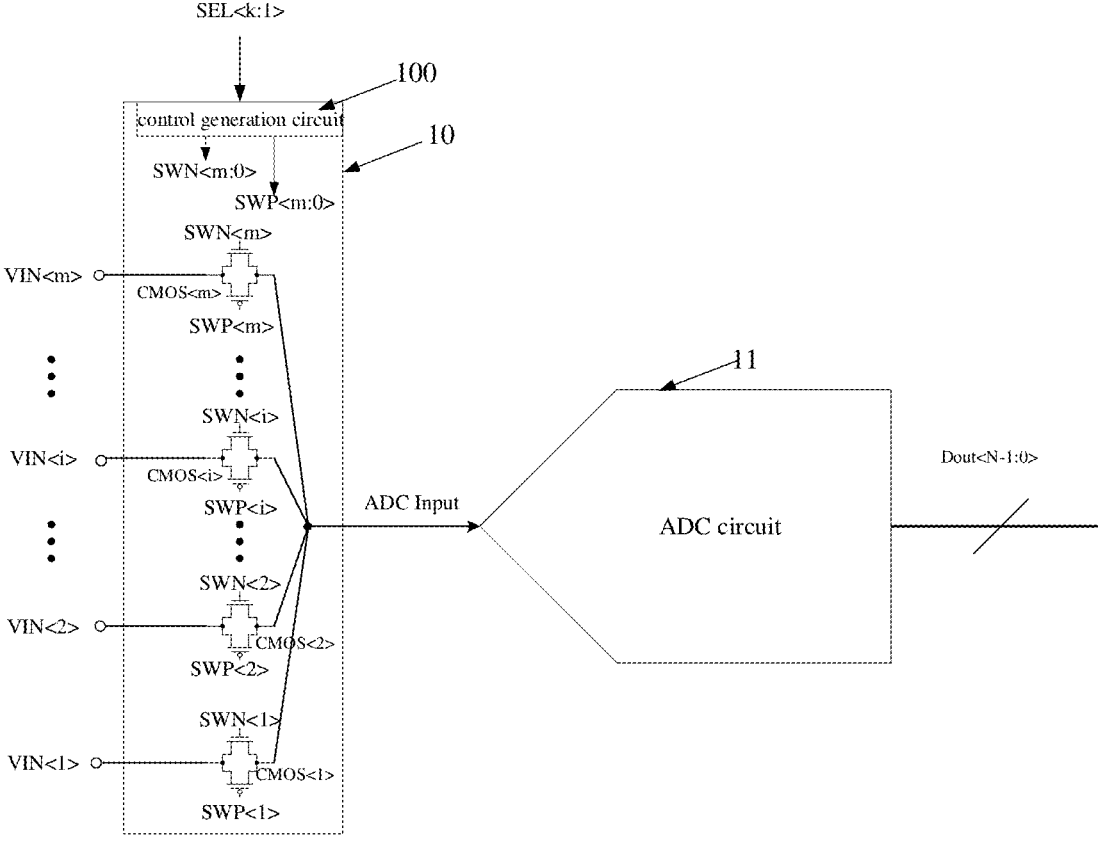
FIG. 2 is a schematic detailed circuit diagram of an ADC with a channel selection circuit.

Referring to FIG. 2, in an analog-to-digital converter (ADC) with a channel selection circuit 10, all channel switches in the channel selection circuit 10 are implemented as CMOS switches. Specifically, the channel selection circuit 10 includes a control generation circuit 100 and m CMOS switches CMOS<m:1> each consisting of an NMOS switch and a PMOS switch connected in parallel to the NMOS switch. The control generation circuit 100 generates, based on a channel selection signal Select<k:1>, complementary control signals SWN<m:1> and SWP<m:1> for controlling the M CMOS switches CMOS<m:1>, which are then applied as voltages to gates of the NMOS and PMOS switches in the M CMOS switches. For the CMOS switch CMOS<i>, when the control signal SWN<i> is high and SWP<i> is low, the channel including the CMOS switch CMOS<i> is turned on. At a single time point, at most one of the m CMOS switches CMOS<m:1> can be turned on to allow a corresponding analog input signal VIN<i> to be selected as an input signal ADC_Input for an ADC circuit 11.

This circuit operates in a simple manner and can be easily implemented. When any of the CMOS switches is turned on, its resistance can be expressed as:

$$R_{on} = \frac{1}{\mu_n C_{ox}\left(\frac{W}{L}\right)_N (VDD - V_{thn}) - \mu_p C_{ox}\left(\frac{W}{L}\right)_P |V_{thp}| - \left[\mu_n C_{ox}\left(\frac{W}{L}\right)_N - \mu_p C_{ox}\left(\frac{W}{L}\right)_P\right]V_{in}},$$

where $(W/L)_N$ is a width-to-length ratio of the NMOS switch in the CMOS switch, $\mu_n$ is mobility of the NMOS switch, $V_{thn}$ is a threshold voltage of the NMOS switch, $(W/L)_P$ is a width-to-length ratio of the PMOS switch in the CMOS switch, $\mu_p$ is mobility of the NMOS switch, Vthp is a threshold voltage of the PMOS switch, $C_{ox}$ is specific capacitance of gate oxide in the CMOS switch, and $V_{in}$ is a voltage of the analog input signal at the time when the CMOS switch is turned on.

This design suffers from at least the following deficiencies:

(1) When not considering the body-bias effect of the MOS switch, theoretically, if $\mu_n C_{ox}(W/L)_N = \mu_p C_{ox}(W/L)_P$, on-resistance $R_{on}$ of the CMOS switch is independent of the voltage $V_{in}$ of the analog input signal, and the CMOS switch will have constant on-resistance $R_{on}$ and ideal linearity. However, in practice, the on-resistance $R_{on}$ of the CMOS switch varies with the voltage $V_{in}$ of the analog input signal VIN<m:1>, the threshold voltage Vthp of the PMOS transistor and the threshold voltage $V_{thn}$ of the NMOS transistor, introducing non-linearity to the ADC.

(2) Generally, a substrate of the NMOS switch is coupled to ground VSS, and a substrate of the PMOS switch is coupled to a power supply voltage VDD. Both of them suffer from the body-bias effect. Specifically, the threshold voltage $V_{th}$ of the NMOS or PMOS switch can be expressed as:

$$V_{th} = V_{th0} + \gamma\left[\sqrt{|2\phi_F| + V_{BS}} - \sqrt{|2\phi_F|}\right],$$

where $V_{BS}$ is a source-to-substrate bias voltage, $V_{th0}$ is a threshold voltage at VBS=0, and $\gamma$ is a process-related parameter, referred to as the body effect coefficient. Fermi potential $\phi_F$ is a parameter relating to a built-in junction potential kT/q (where k is the Boltzmann constant which is equal to $1.38e^{-23}$ J/K, T is temperature, and q is the magnitude of a charge of one elementary charge which is equal to $1.6e^{-19}$ C), a dopant concentration Nsub of the substrate and an intrinsic carrier concentration $n_i$ of the substrate and is given by:

$$\phi_F = \left(\frac{kT}{q}\right)ln(N_{sub}/n_i).$$

When the CMOS switch is turned on, $V_{BS}=V_{in}$ for the NMOS switch, and $V_{BS}=VDD-V_{in}$ for the PMOS switch. As can be seen, the threshold voltage $V_{thn}$ of the NMOS switch and the threshold voltage $V_{thp}$ of the PMOS switch vary with the voltage $V_{in}$ of the analog input signal. The body-bias effect of the NMOS and PMOS switches degrades the linearity of the CMOS switch. When the power supply voltage VDD$<V_{thn}+|V_{thp}|$, and if the input signal is within the range [VDD−Vthn, |Vthp|], the CMOS switch will be turned off. Thus, when operating at a low voltage, turn-on performance of the CMOS switches will be too poor to meet the requirements of high-speed, high-accuracy ADCs. In particular, the channel switches may fail to be turned on at a low power supply voltage. Therefore, this design is not suitable for use in a channel selection circuit of a high-speed, high-accuracy ADC operating at a low power supply voltage.

Obviously, due to the increasing demand of SoC chips for more accurate on-chip ADCs and increasingly wider power supply voltage VDD ranges of modern ADCs, it has been very difficult for the above-described channel selection circuit design to meet the requirements of a high-speed, high-accuracy ADC operating at a low power supply voltage.

In view of this, the present invention provides a channel selection circuit, an ADC and an SoC. The channel selection circuit can eliminate the body-bias effect of MOS switches included therein and thus exhibits significantly improved linearity. The ADC can provide the required high speed and high accuracy and exhibits excellent performance even at a low power supply voltage.

Compared with the prior art, the present invention has at least one of the benefits as follows:

1. During a sampling phase of the ADC circuit, the substrate voltage of the MOS switch in a selected channel is set to the voltage of the analog input signal to which the selected channel is coupled. This eliminates the body-bias effect of the MOS switch, greatly improving linearity of the channel selection circuit and enabling the ADC to provide the required high speed and high-accuracy and exhibit excellent performance even at a low power supply voltage. Moreover, harmonic distortion around the dominant frequency can be suppressed, enabling the ADC to provide the required high accuracy (e.g., a 16-bit or even higher resolution).

2. For any MOS switch in the MOS switch channel circuit, it is turned on only when the corresponding channel is selected during a sampling phase of the ADC. Otherwise, it remains OFF. In this way, once activated, the device will have constant on-resistance, which further enhances linearity of the channel selection circuit.

3. In additional implementations, during a conversion phase of the ADC, a substrate voltage of an NMOS switch in a selected channel is pulled to the ground, and a substrate voltage of a PMOS switch in the selected channel is pulled to the power supply voltage. In further implementations, during sampling and conversion phases of the ADC, substrate voltages of NMOS switches in unselected channels are pulled to the ground, and substrate voltages of PMOS switches in the unselected channels are pulled to the power supply voltage. According to any of these implementations, harmonic distortion around the dominant frequency can be suppressed, enabling the ADC to provide the required high accuracy (e.g., a 16-bit or even higher resolution).

The present invention will be described in greater detail below with reference to the accompanying drawings by way of specific embodiments. From the following description, advantages and features of the present invention will become more apparent. Note that the figures are provided in a very simplified form not necessarily drawn to exact scale and for the only purpose of facilitating easy and clear description of the disclosed embodiments.

Embodiment 1

Figure 3:
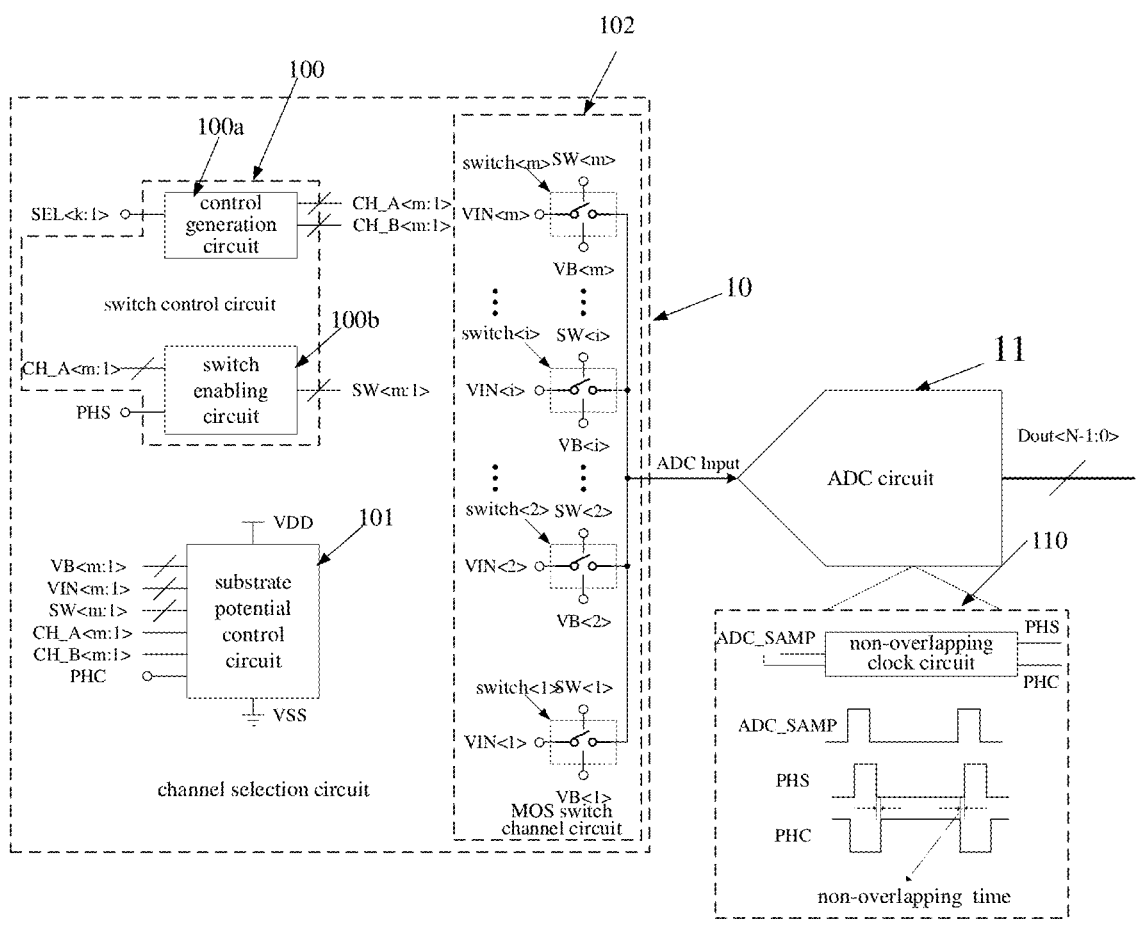
FIG. 3 is a system block diagram of a channel selection circuit and an ADC in which it is included according to a first embodiment of the present invention.

Referring to FIG. 3, in a first embodiment, a channel selection circuit 10 and an analog-to-digital converter (ADC) including the channel selection circuit 10 and an ADC circuit 11 are provide. As a front-end circuit of the ADC circuit 11, the channel selection circuit 10 has a signal input terminal coupled to m analog input signals VIN<m:1> and a signal output terminal coupled to an input terminal of the ADC circuit 11. The channel selection circuit 10 selects one of the m analog input signals VIN<m:1> each time as an input ADC_Input to the ADC circuit 11 and outputs it to the input terminal of the ADC circuit 11. The ADC circuit 11 is configured to convert the analog input signal (i.e., ADC_Input) selected by the channel selection circuit 10 into a digital signal Dout<N−1:0>.

In Embodiment 1, the ADC circuit 11 includes an internal non-overlapping clock circuit 110, which may adopt any suitable circuit design. The non-overlapping clock circuit 110 receives an ADC sampling signal ADC_SAMP and outputs a sampling phase signal PHS and a conversion phase signal PHC. PHS and PHC are a pair of two-phase non-overlapping clock signals, which are offset from each other by an amount of time determined by a delay time of a delay circuit (e.g., a DLL circuit, etc.) in the non-overlapping clock circuit 110.

In Embodiment 1, the channel selection circuit 10 specifically includes a switch control circuit 100, a substrate potential control circuit 101 and a MOS switch channel circuit 102.

The switch control circuit 100 is configured to generate, during a sampling phase of the ADC circuit 11 (i.e., when PHS=1 and PHC=0), first switch control signals (SW<m:1>) based on a channel selection signal SEL<k:1>.

The MOS switch channel circuit 102 has m channels each provided with a MOS switch (i.e., <1> to <m>), which may be implemented as any suitable switch with four terminals: a signal input terminal coupled to one of the analog input signals VIN<m:1> (i.e., VIN<1> to VIN<m>); a signal output terminal coupled to the input terminal of the ADC circuit 11; a control terminal: coupled to one of the first switch control signals SW<m:1> (i.e., SW<1> to SW<m>) from the switch control circuit 100 and configured to turn on or off the specific MOS switch; and a substrate terminal coupled to an output terminal of the substrate potential control circuit 101. An input terminal of the MOS switch channel circuit 102 is coupled to the m analog input signals VIN<m:1> and the m analog input signals VIN<m:1> are provided to the m channels. For each channel, only when it is selected by one of the first switch control signals SW<m: 1> and the corresponding MOS switch is turned on, the corresponding analog input signal VIN is output as an input ADC_Input of the ADC circuit 11.

In further exemplary embodiments, the MOS switches (i.e., <1> to <m>) may include, but are not limited to, NMOS switches, PMOS switches, CMOS switches and bootstrap switches. Substrate voltages VB<m:1> of the MOS switches can be controlled individually to take on different values in different states. When a channel is selected by the SEL<k:1>, the respective switch <i> will be turned on only in an ADC sampling phase. Otherwise, it remains OFF. Further, when the switch <i> is turned on, a substrate of an NMOS transistor therein is coupled to the respective input VIN<i> (in case of the switch <i> further having a PMOS transistor, its substrate is also coupled to the respective input VIN<i>). However, when the switch <i> is turned off, the substrate of its NMOS transistor is coupled to the lowest, i.e., a ground voltage VSS (in case of the switch further having the PMOS transistor, its substrate is coupled to the highest voltage, i.e., a power supply voltage VDD).

Figure 17:
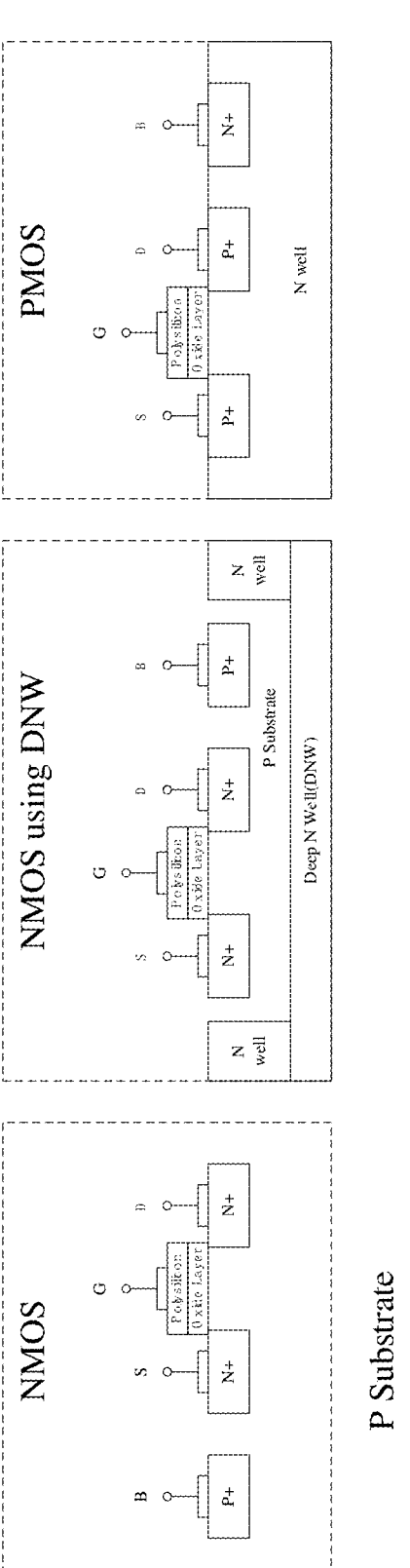
FIG. 17 schematically illustrates a conventional NMOS transistor, an NMOS transistor formed using a DNW process in accordance with an embodiment of the present invention and a PMOS transistor.

In further exemplary embodiments, the MOS switch of each channel (i.e., <1> to <m>) is an NMOS switch (e.g., implemented as an NMOS transistor) formed using a deep N-well (DNW) process, or is a CMOS switch (i.e., consisting of an NMOS transistor and a PMOS transistor connected in parallel to the NMOS transistor). FIG. 17 schematically illustrates a conventional NMOS transistor, an NMOS transistor formed using a DNW process in accordance with the present invention and a PMOS transistor. As shown in FIG. 17, each of the three types of MOS transistors is fabricated using a P-substrate process, i.e., entirely on a P-substrate. The DNW is an N-well located under a MOS transistor and above the P-substrate. The DNW can work together with conventional N-wells formed at its opposite sides to make substrate of the NMOS transistor that is above the DNW to be independent of the P-substrate, thus, the NMOS switch of the application is implemented by the NMOS transistor with DNW, allowing independent control of its substrate voltage VB_N. Further, as shown in FIG. 17, as the PMOS transistor is formed in an individual N-well, the substrate voltage VB_P of the PMOS transistor is also independently controllable.

In Embodiment 1, the switch control circuit 100 includes a control generation circuit 100a and a switch enabling circuit 100b. The control generation circuit 100a decodes and parses the k-bit channel selection signal SEL<k:1> and generates m pairs of first signals CH_A<m:1> (i.e., CH_A<1> to CH_A<m>) and second signals CH_B<m:1> (i.e., CH_B<1> to CH_B<m>) that are complementary to the first signals. A first input terminal of the switch enabling circuit 100b is coupled to the m first control signals CH_A<m:1> from the control generation circuit 100a. A second input terminal of the switch enabling circuit 100b is coupled to the sampling phase signal PHS from the ADC circuit 11. The switch enabling circuit is configured to generate the m first switch control signals SW<m:1> based on the m first control signals CH_A<m:1> and the sampling phase signal PHS and provide them to the substrate potential control circuit 101. By default, the first control signals CH_A<m:1> are all 0's, the second control signals CH_B<m:1> are all 1's, and the switches <1> to <m> (i.e., the MOS switches of all the channels) are all OFF. When channel i (i is any of 1 to m) is selected by SEL<k:1>, CH_A<i>=1 (CH_A=0 for all the other channels) and CH_B<i>=0 (CH_B=1 for all the other channels). Moreover, during a sampling phase, ADC_SAMP=1, PHS=1 and PHC=0. When channel i (i is any of 1 to m) is selected by SEL<k:1>, SW<i>=1 (SW=0 for all the other channels). As a result, the respective switch <i> out of the switches <1> to <m> corresponding to channel i is turned on.

Figure 4:
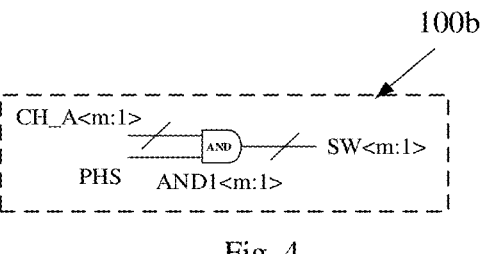
FIG. 4 is a schematic diagram showing an example of the structure of a switch enabling circuit according to the first embodiment of the present invention.

Each of the control generation circuit 100a and the switch enabling circuit 100b may adopt any suitable circuit design. The control generation circuit 100a may be implemented as a circuit design commonly used in the art, and detailed description thereof is omitted herein. Referring to FIG. 4, in one embodiment, the switch enabling circuit 100b includes a first AND logic circuit AND1<m:1>. For example, the first AND logic circuit AND1<m:1> may include m first AND gates (not all shown in FIG. 4) corresponding to the respective m channels in the MOS switch channel circuit 102. The m first AND gates may be all two-input AND gates each configured to perform an AND logic operation on a respective first control signal CH_A of the m first control signals CH_A<m:1> and the sampling phase signal PHS to generate a respective one of the first switch control signals SW. For example, the respective first AND gate AND1<i> corresponding to channel i (i is any of 1 to m) is configured to perform an AND logic operation on the first control signal CH_A<i> and the sampling phase signal PHS to generate the respective first switch control signals SW<i>. In this way, the first AND logic circuit AND1<m:1> can output a total of m first switch control signals SW<m:1> for turning on the respective switches <1> to <m> in the m channels or not during an ADC sampling phase. That is, m SW<m:1>=CH_A<m:1>*PHS.

In Embodiment 1, input terminals of the substrate potential control circuit 101 are coupled to the respective m analog input signals VIN<m:1> and the respective m first switch control signals SW<m:1>, and its output terminals VB<m:1> are coupled to the respective substrates of the MOS switches in the MOS switch channel circuit 102. The substrate potential control circuit 101 is adapted to control the substrate voltages VB<m:1> of the MOS switches in the MOS switch channel circuit 102. It functions such that when, and only when, channel i (i is any of 1 to m) in the MOS switch channel circuit 102 is selected (i.e., CH_A<i>=1 and CH_B<i>=0) during a sampling phase (i.e., PHS=1 and PHC=0), the substrate voltage VB<i> of the switch <i> in the MOS switch channel circuit 102 is coupled to the respective analog input signal VIN<i>. In further exemplary embodiments, if the switch <i> includes an NMOS transistor (in this case, it is also referred to as an NMOS switch), a substrate potential VB_N<i> of the NMOS transistor is coupled to VIN<i>. Moreover, if the switch <i> includes a PMOS transistor (in this case, it is also referred to as a PMOS switch), a substrate potential VB_P<i> of the PMOS transistor is also coupled to VIN<i>.

In Embodiment 1, the substrate potential control circuit 101 may adopt any suitable circuit design. As an example, referring to FIG. 5A, the substrate potential control circuit 101 may include first switch circuits Switch1<m:1>. In other exemplary embodiments, the substrate potential control circuit 101 may further include a second AND logic circuit AND2<m:1>, second switch circuits M2<m:1> and third switch circuits M3<m:1>. In one exemplary embodiment, control terminals of the first switch circuits Switch1<m:1> (e.g., gates of NMOS transistors) are coupled to the m first switch control signals SW<m:1>, input terminals of the first switch circuits Switch1<m:1> (e.g., sources of the NMOS transistors) are coupled to the analog input signals VIN<m:1> received by the ADC circuit 11, and output terminals of the first switch circuits Switch1<m:1> (e.g., drains of the NMOS transistors) are coupled to the substrates of the switches <m:1> (i.e., the <1> to <m>) in the MOS switch channel circuit 102. Under the control of the first switch control signals SW<m:1>, the first switch circuits Switch1<m:1> output the m analog input signals VIN<m:1> as m substrate voltage signals VB<m:1> and provide them to the substrates of the MOS switches in the channels of the MOS switch channel circuit 102.

In further exemplary embodiments, the substrate potential control circuit 101 may further include a second AND logic circuit AND2<m:1>, second switch circuits M2<m:1> and third switch circuits M3<m:1>. The second AND logic circuit AND2<m:1> is configured to perform AND logic operations on the m first control signals CH_A<m:1> and the conversion phase signal PHC from the ADC circuit 11 to output m second switch control signals SW_C<m:1>. That is, SW_C<m:1>=CH_A<m:1>*PHC. As noted above, the conversion phase signal PHC and the sampling phase signal PHS are a pair of two-phase non-overlapping clock signals.

Control terminals of the second switch circuits M2<m:1> (e.g., gates of NMOS transistors) are coupled to the m second switch control signals SW_C<m:1>, input terminals of the second switch circuits M2<m:1> (e.g., sources of the NMOS transistors) are coupled to the ground VSS (applicable to the case of NMOS switches) and output terminals of the second switch circuits M2<m:1> (e.g., drains of the NMOS transistors) are coupled to the output terminals of the substrate potential control circuit 101 (for providing VB<m:1>). Under the control of m second switch control signals SW_C<m:1>, the second switch circuits M2<m:1> pull the voltages VB<m:1> at the output terminals of the substrate potential control circuit 101 to the ground VSS (applicable to the case of the MOS switches in the MOS switch channel circuit 102 being implemented as NMOS transistors) or to the power supply voltage VDD (applicable to the case of the MOS switches in the MOS switch channel circuit 102 being implemented as PMOS transistors, not shown in FIG. 5A).

Figure 6:
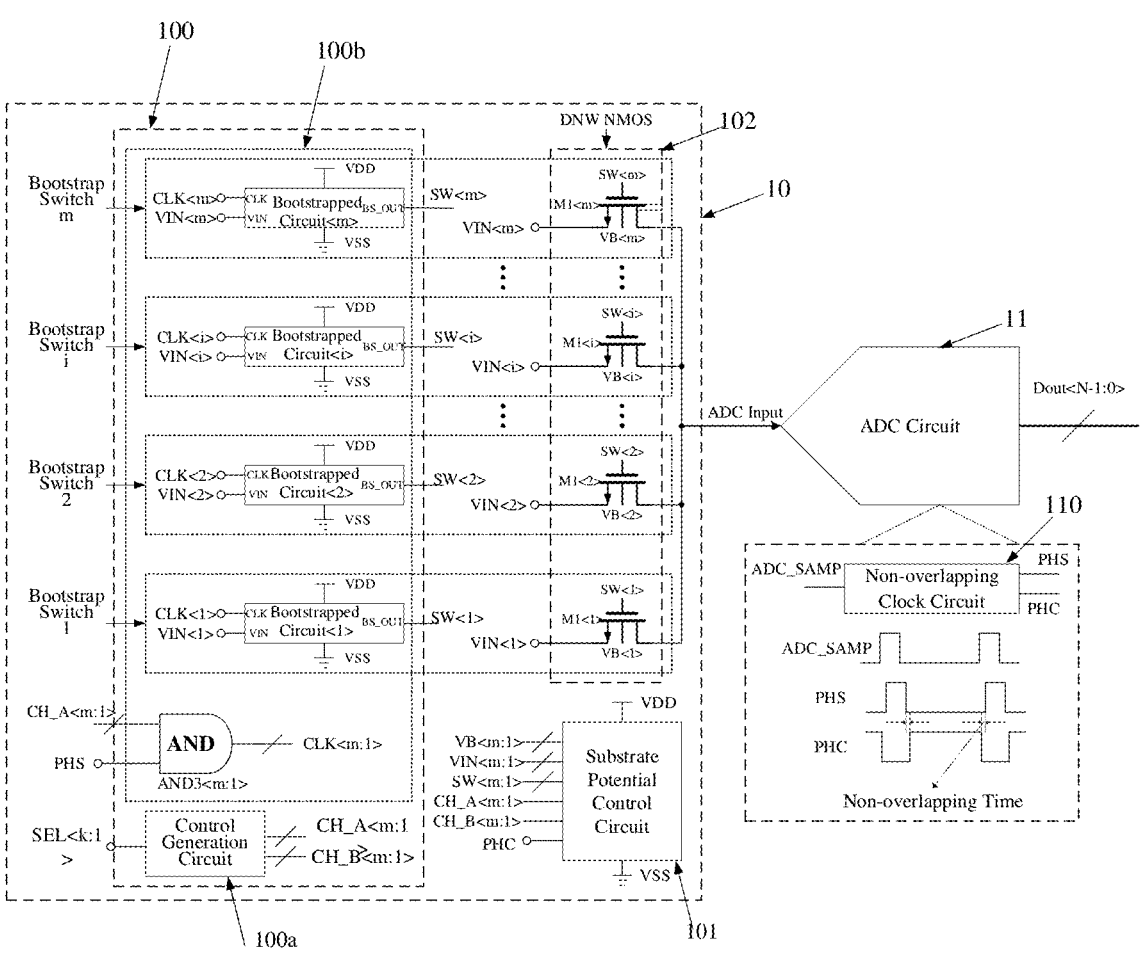
FIG. 6 is a system block diagram of a channel selection circuit and an ADC in which it is included according to a second embodiment of the present invention.
Figure 14:
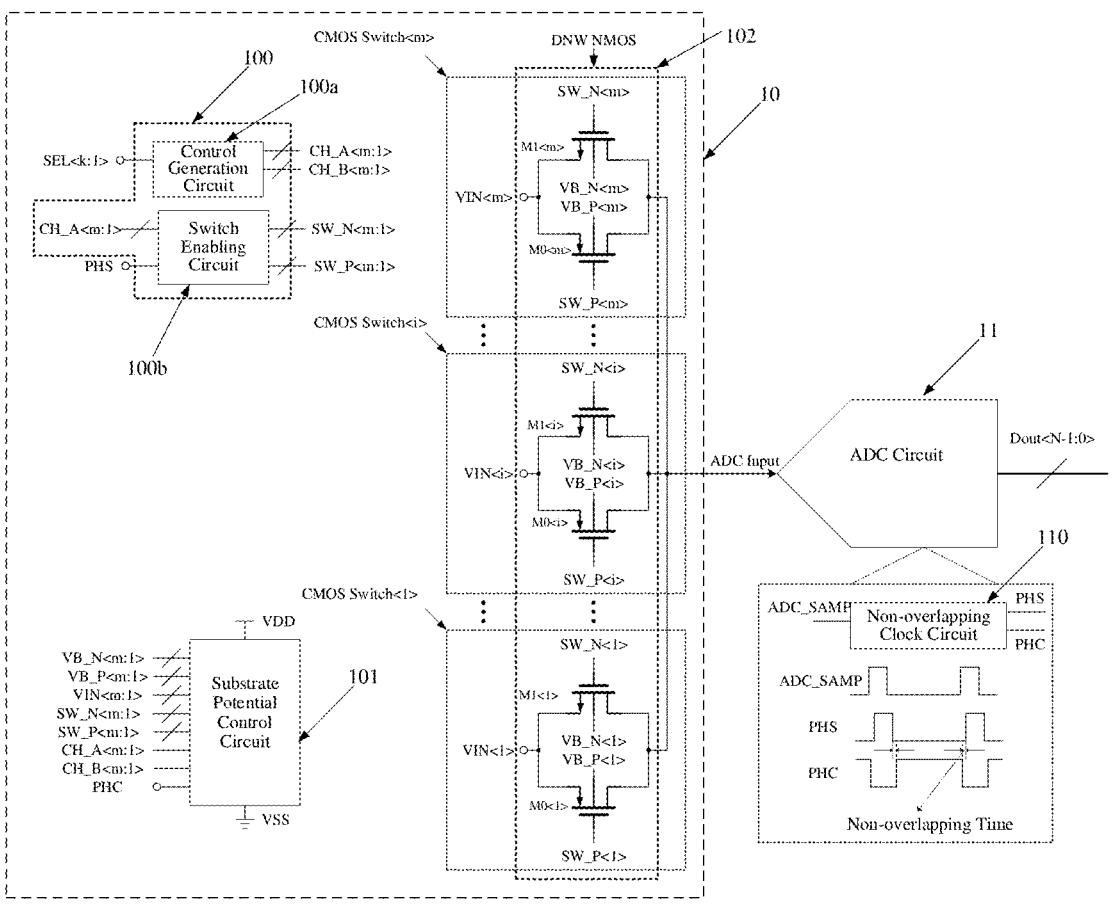
FIG. 14 is a system block diagram of a channel selection circuit and an ADC in which it is included according to a third embodiment of the present invention.

Further, in case of all the MOS switches <m:1> being implemented as CMOS switches (e.g., as shown in FIG. 14), the second switch circuits M2<m:1> pull output terminals of 101 (e.g., VB_N<m:1> in FIG. 16A) coupled to substrates of NMOS switches M1<m:1> in the CMOS switches to the ground VSS and output terminals of 101 (e.g., VB_P<m:1> in FIG. 16A) coupled to substrates of PMOS switches M0<m:1> in the CMOS switches to the power supply voltage VDD. In case of all the MOS switches <m:1> being implemented as NMOS switches (e.g., as shown in FIG. 6), the second switch circuits M2<m:1> pull the output terminals of 101 (e.g., VB<m:1> in FIG. 7A) coupled to substrates of the NMOS switches M1<m:1> to the ground.

Control terminals of the third switch circuits M3<m:1> are coupled to m second control signals CH_B<m:1>, input terminals of the third switch circuits M3<m:1> are coupled to the ground VSS, and output terminals of the third switch circuits M3<m:1> are coupled to the output terminals of the substrate potential control circuit 101 (for providing VB<m:1>). Under the control of the m second control signals CH_B<m:1>, the third switch circuits M3<m:1> pull the voltages VB<m:1> at the output terminals of the substrate potential control circuit 101 to the ground VSS (applicable to the case of the MOS switches in the MOS switch channel circuit 102 being implemented as NMOS transistors) or to the power supply voltage VDD (applicable to the case of the MOS switches in the MOS switch channel circuit 102 being implemented as PMOS transistors, not shown in FIG. 5A).

Further, in case of the MOS switches being implemented as CMOS switches (e.g., as shown in FIG. 14), the third switch circuits M3<m:1> pull output terminals of 101 (e.g., VB_N<m:1> in FIG. 16A) coupled to substrates of NMOS switches M1<m:1> in the CMOS switches to the ground VSS and output terminals of 101 (e.g., VB_P<m:1> in FIG. 16A) coupled to substrates of PMOS switches M0<m:1> in the CMOS switches to the power supply voltage VDD. In case of the MOS switches being implemented as NMOS switches (e.g., as shown in FIG. 6), the third switch circuits M3 pull the output terminals of 101 (e.g., VB<m:1> in FIG. 7A) coupled to substrates of the NMOS switches M1<m:1> to the ground.

It would be appreciated that all the first switch circuits Switch1<m:1>, the second AND logic circuit AND2<m:1>, the second switch circuits M2<m:1> and the third switch circuits M3<m:1> may employ any suitable circuit designs. For example, the second AND logic circuit AND2<m:1> may include m second AND gates (not all shown in FIG. 5A) corresponding to the m channels in the MOS switch channel circuit 102, and the first switch circuits Switch1<m:1>, the second switch circuit M2<m:1> and the third switch circuit M3<m:1> may all include m MOS switches (possibly all implemented as NMOS switches). For example, for channel i, the first switch circuit Switch1<i>, the second switch circuit M2<i> and the third switch circuit M3<i> may make up a branch of the substrate potential control circuit for providing the substrate voltage signal VB<i> to the corresponding substrate of the switch <i> in the MOS switch channel circuit 102. For another example, the switches in the first switch circuits Switch1<m:1> may be of the same type as the switches <m:1> in the MOS switch channel circuit 102. That is, when the switches <m:1> are implemented as NMOS switches, all the switches of the first switch circuits Switch1<m:1> are also implemented as NMOS switches. When the switches <m:1> are implemented as CMOS switches, all the switches of the first switch circuits Switch1<m:1> are also implemented as CMOS switches.

To sum up, when the switches <m:1> in the MOS switch channel circuit 102 are all implemented as NMOS switches, irrespective of whether the ADC circuit is in a conversion phase or a sampling phase, the substrate potential control circuit 101 pulls the substrate voltages of all the NMOS switches in the unselected channels to the ground VSS. Alternatively, when the switches <m:1> in the MOS switch channel circuit 102 are all implemented as CMOS switches, the substrate voltages of the NMOS switches in the CMOS switches of the unselected channels are pulled to the ground VSS, and the substrate voltages of the PMOS switches in the CMOS switches of the unselected channels are pulled to the power supply voltage VDD.

Further, when all the switches <m:1> in the MOS switch channel circuit 102 are implemented as NMOS switches, the substrate potential control circuit 101 is configured to connect the substrate voltage of the NMOS switch in the selected channel i to the analog input signal VIN<i> coupled to the selected channel i during a sampling phase and to pull the substrate voltage of the NMOS switch in the selected channel i to the ground VSS during a conversion phase. Alternatively, with combined reference to FIG. 14, when all the switches <m:1> in the MOS switch channel circuit 102 are implemented as CMOS switches, the substrate potential control circuit 101 is configured to connect the substrate voltages VB_N<i> of the NMOS switch M1<i> and VB_P<i> of the PMOS switch M0<i> in the CMOS switch in the selected channel i to the analog input signal VIN<i> coupled to the selected channel i during a sampling phase and to pull the substrate voltage VB_N<i> of the NMOS switch M1<i> in the CMOS switch of the selected channel i to the ground VSS and the substrate voltage VB_P<i> of the PMOS switch M0<i> in the CMOS switch of the selected channel i to the power supply voltage VDD during a conversion phase.

In Embodiment 1, the switches <1> to <m> in the MOS switch channel circuit 102 are implemented as NMOS switches, for example, and the channel selection circuit 10 may operate in the manner detailed below.

For any channel i, when it is not selected, CH_A$<i>$=0 and CH_B$<i>$=1, and no matter whether ADC sampling takes place, SW$<i>$=0, SW_C$<i>$=0, and both Switch1$<i>$ and M2$<i>$ are OFF. CH_B$<i>$ controls the gate of M3$<i>$ and thus turns M3$<i>$ on, pulling the substrate voltage VB$<i>$ of the switch $<i>$ in the MOS switch channel circuit 102 to the ground VSS and keeping M1$<i>$ OFF. That is, the substrate potential control circuit 101 can pull the substrate voltages VB of the NMOS switches in the unselected channels of the MOS switch channel circuit 102 to the ground VSS during conversion and sampling phases of the ADC circuit 11.

When channel i is selected and the ADC sampling signal is low (i.e., ADC_SAMP=0), CH_A$<i>$=1, CH_B$<i>$=0, the non-overlapping clock circuit 110 outputs PHS=0 and PHC=1, SW$<i>$=0, SW_C$<i>$=1 and both Switch1$<i>$ and M3$<i>$ are OFF. SW_C$<i>$ controls the gate of M2$<i>$ and thus turns the switch M2$<i>$ on, pulling the substrate voltage VB$<i>$ of M1$<i>$ to the ground VSS and keeping the switch $<i>$ OFF.

When channel i is selected and the ADC sampling signal is high (i.e., ADC_SAMP=1), the control generation circuit 100a outputs CH_A$<i>$=1 and CH_B$<i>$=0 and the non-overlapping clock circuit 110 outputs PHS=1 and PHC=0. As a result, SW$<i>$=1, SW_C$<i>$=0, and M2$<i>$ and M3$<i>$ are both OFF. SW$<i>$ controls the turn on of Switch1$<i>$, and VB$<i>$=VIN$<i>$. That is, the substrate voltage VB$<i>$ of the switch $<i>$ in the selected channel i is equal to its source voltage VIN$<i>$, eliminating the body-bias effect of the switch $<i>$ in channel i and significantly increasing linearity of channel i.

Figure 5A:
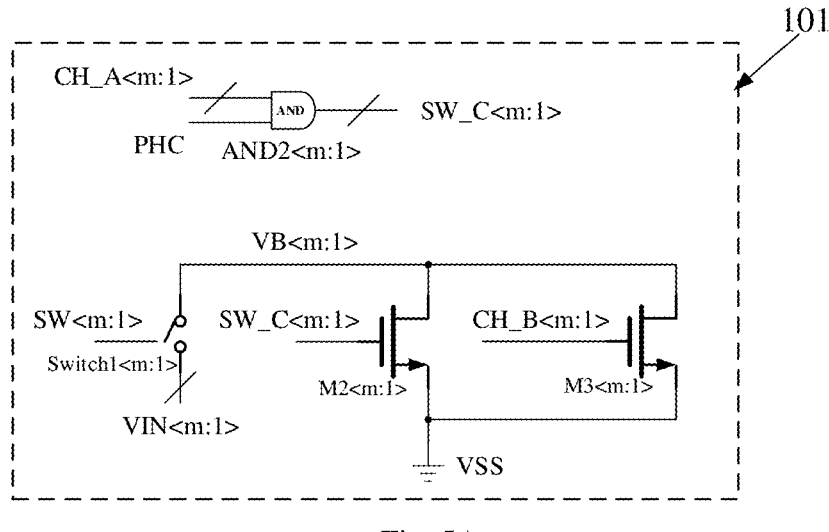
FIGS. 5A and 5B are schematic diagrams showing two exemplary structures of a substrate potential control circuit according to the first embodiment of the present invention.
Figure 5B:
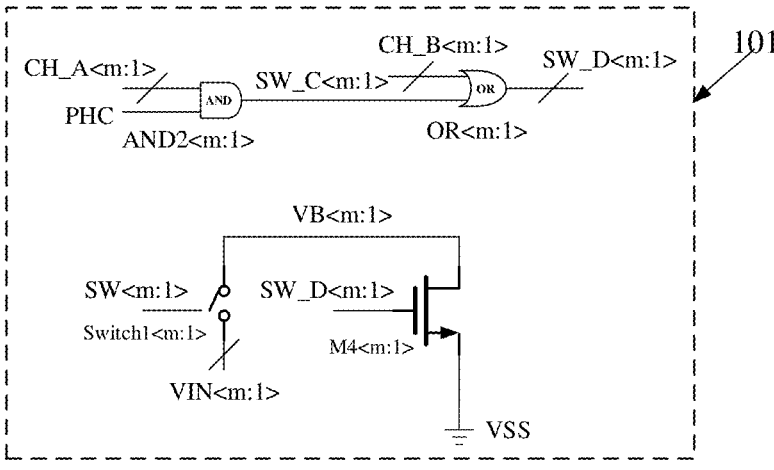

In another embodiment, referring to FIG. 5B, the substrate potential control circuit 101 includes first switch circuits Switch1$<m:1>$. In a further embodiment, the substrate potential control circuit 101 further includes a second AND logic circuit AND2$<m:1>$, an OR logic circuit OR$<m:1>$ and fourth switch circuits M4$<m:1>$. In one embodiment, control terminals of the first switch circuits Switch1$<m:1>$ (e.g., gates of NMOS transistors) are coupled to m first switch control signals SW$<m:1>$, input terminals of the first switch circuits Switch1$<m:1>$ (e.g., sources of the NMOS transistors) are coupled to the analog input signals VIN$<m:1>$ of the ADC circuit 11 and output terminals of the first switch circuits Switch1$<m:1>$ (e.g., drains of the NMOS transistors) are coupled to substrates of switches $<m:1>$ (i.e., $<1>$ to $<m>$) in the MOS switch channel circuit 102. Under the control of the first switch control signals SW$<m:1>$, the first switch circuits Switch1$<m:1>$ output the m analog input signals VIN$<m:1>$ as m substrate voltage signals VB$<m:1>$ and provide them to the substrates of the MOS switches in the channels of the MOS switch channel circuit 102.

In further embodiments, the substrate potential control circuit 101 further includes a second AND logic circuit AND2$<m:1>$, an OR logic circuit OR$<m:1>$ and fourth switch circuits M4$<m:1>$. The second AND logic circuit AND2$<m:1>$ is configured to perform AND logic operations on the m first control signals CH_A$<m:1>$ and the conversion phase signal PHC from the ADC circuit 11 to output m second switch control signals SW_C$<m:1>$. That is, SW_C$<m:1>$=CH_A$<m:1>$*PHC. As noted above, the conversion phase signal PHC and the sampling phase signal PHS are a pair of two-phase non-overlapping clock signals.

First input terminals of the OR logic circuit OR$<m:1>$ are coupled to the m second control signals CH_B$<m:1>$, and second input terminals of the OR logic circuit OR$<m:1>$ are coupled to the m second switch control signals SW_C$<m:1>$. The OR logic circuit OR$<m:1>$ is configured to perform OR logic operations on the m second control signals CH_B$<m:1>$) and m second switch control signals SW_C$<m:1>$ to generate m third switch control signals SW_D$<m:1>$.

Control terminals of the fourth switch circuits M4$<m:1>$ are coupled to m third switch control signals SW_D$<m:1>$, input terminals of the fourth switch circuits M4$<m:1>$ are coupled to the ground VSS (applicable to the case of NMOS switches) and output terminals of the fourth switch circuits M4$<m:1>$ are coupled to output terminals of the substrate potential control circuit 101 (for providing VB$<m:1>$). Under the control of the m third switch control signals SW_D$<m:1>$, the fourth switch circuits M4$<m:1>$ pull the voltages VB$<m:1>$ at the output terminals of the substrate potential control circuit 101 to the ground VSS (applicable to the case of the MOS switches in the MOS switch channel circuit 102 being implemented as NMOS transistors) or to the power supply voltage VDD (applicable to the case of the MOS switches in the MOS switch channel circuit 102 being implemented as PMOS transistors, not shown in FIG. 5B).

Further, in case of the MOS switches being implemented as CMOS switches (e.g., as shown in FIG. 14), the fourth switch circuits M4$<m:1>$ pull: output terminals of 101 (e.g., VB_N$<m:1>$ in FIG. 16B) coupled to substrates of NMOS switches M1$<m:1>$ in the CMOS switches to the ground VSS; and output terminals of 101 (e.g., VB_P$<m:1>$ in FIG. 16B) coupled to substrates of PMOS switches M0$<m:1>$ in the CMOS switches to the power supply voltage VDD. In case of the MOS switches being implemented as NMOS switches (e.g., M1 in FIG. 6), the fourth switch circuits M4$<m:1>$ pull the output terminals of 101 (e.g., VB$<m:1>$ in FIG. 7B) coupled to substrates of the NMOS switches M1$<m:1>$ to the ground.

Likewise, in embodiment 1, for the MOS switch $<i>$ in channel i, it is activated (i.e., turned on) only when it is selected during an ADC sampling phase. Moreover, during the ADC sampling phase, on-resistance Ron of the MOS switch $<i>$ in the selected channel i is constant and is not related to the input signal VIN$<i>$, resulting in a great increase in linearity of channel i.

It is noted that in the exemplary embodiments of FIGS. 5A and 5B, the switches $<m:1>$ (i.e., $<1>$ to $<m>$), M2$<m:1>$, M3$<m:1>$ and M4$<m:1>$ are all shown as NMOS switches, the substrate potential control circuit 101 needs to pull the substrate voltage VB$<i>$ of the switch $<i>$ down to the ground VSS in case of channel i being unselected. Therefore, the input terminals of M2$<m:1>$, M3$<m:1>$ and M4$<m:1>$ are all coupled to the ground VSS. However, the present embodiment is not so limited. The switches $<m:1>$ (i.e., $<1>$ to $<m>$) may be alternatively implemented as PMOS switches. The substrate potential control circuit 101 needs to pull the substrate voltage VB$<i>$ of the switch $<i>$ to the power supply voltage VDD in case of channel i being unselected. M2$<m:1>$, M3$<m:1>$ and M4$<m:1>$ may also be replaced with PMOS switches, and their input terminals may all be coupled to the power supply voltage VDD. For more details in this regard, reference can be made to the circuit portions related to the PMOS switches shown in FIGS. 16A and 16B.

Based on the same inventive concept, referring to FIG. 3, in Embodiment 1, an analog-to-digital converter (ADC) including an ADC circuit 11 and the channel selection circuit 10 as defined above is provided. The channel selection circuit 10 is coupled to m analog input signals VIN$<m:1>$ and configured to select one of the m analog input signals VIN$<m:1>$ each time and output it to an input terminal of the ADC circuit 11. The ADC circuit 11 is configured to convert the analog input signal selected by the channel selection circuit 10 to a digital signal Dout<N−1:0>.

Based on the same inventive concept, in Embodiment 1, a system-on-chip (SoC) including the ADC as defined above is provided.

According to Embodiment 1, by using the sampling and conversion phase clock signals PHS, PHC generated by a non-overlapping clock circuit 110 in the ADC and a substrate voltage VB control technique, during an ADC sampling phase, a substrate voltage of a MOS switch in a selected channel is brought to the same level as an analog input signal coupled to the channel, thereby eliminating the body-bias effect of the MOS switch. This means that on-resistance of the MOS switch in the selected channel remains constant through the ADC sampling phase, resulting in significantly improved linearity of the channel selection circuit 10 and enabling the ADC to provide the required high accuracy and exhibit excellent performance even at a low power supply voltage. Additionally, harmonic distortion around the dominant frequency can be suppressed, enabling the ADC to provide the required high accuracy (e.g., a 16-bit or even higher resolution).

Embodiment 2

Referring to FIG. 6, in a second embodiment, a channel selection circuit 10 and an analog-to-digital converter (ADC) including the channel selection circuit 10 and an ADC circuit 11 are provided. As a front-end circuit of the ADC circuit 11, the channel selection circuit 10 has a signal input terminal coupled to m analog input signals VIN<m:1> and a signal output terminal coupled to an input terminal of the ADC circuit 11. The channel selection circuit 10 selects one of the m analog input signals VIN<m:1> each time as an input ADC_Input to the ADC circuit 11 and outputs it to the input terminal of the ADC circuit 11. The ADC circuit 11 is configured to convert the analog input signal selected by the channel selection circuit 10 (i.e., ADC_Input) into a digital signal Dout<N−1:0>. In Embodiment 2, the channel selection circuit 10 also includes a switch control circuit 100, a substrate potential control circuit 101 and a MOS switch channel circuit 102.

In Embodiment 2, the switch control circuit 100 includes a control generation circuit 100*a* and a switch enabling circuit 100*b*. The control generation circuit 100*a* decodes and parses a k-bit channel selection signal SEL<k:1> to generate m pairs of first control signals CH_A<m:1> and second control signals CH_B<m:1> that are complementary to the first control signals. The switch enabling circuit 100*b* includes a third AND logic circuit AND3<m:1> and bootstrapped circuits <m:1>.

Figure 7A:
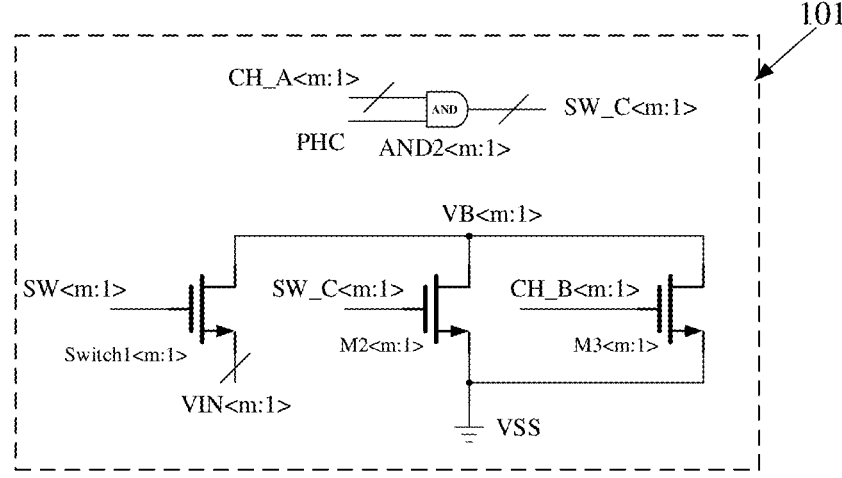
FIGS. 7A and 7B are schematic diagrams showing two exemplary structures of a substrate potential control circuit according to the second embodiment of the present invention.
Figure 7B:
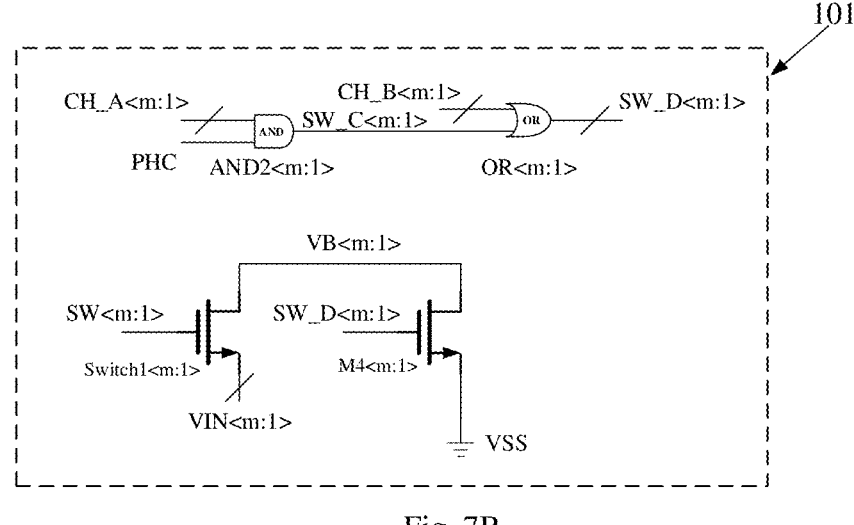

The substrate potential control circuit 101 of Embodiment 2 employs the same design as the substrate potential control circuit 101 of Embodiment 1. Optionally, in Embodiment 2, Swich1<m:1> in the substrate potential control circuit 101 may be implemented as NMOS switches, as shown in FIGS. 7A and 7B. For structural details of the substrate potential control circuit 101 of Embodiment 2, reference can be made to the above description in connection with FIGS. 5A and 5B, and further description thereof is omitted here.

The channel selection circuit 10 of Embodiment 2 differs from the channel selection circuit 10 of the Embodiment 1 particularly in that the MOS switch channel circuit 102 in the channel selection circuit 10 of Embodiment 2 utilizes m NMOS switches (or NMOS transistors) M1<m:1> fabricated using a DNW process to establish m channels and in that the switch enabling circuit 100*b* in the switch control circuit 100 includes a third AND logic circuit AND3<m:1> and bootstrapped circuits <m:1>. The third AND logic circuit AND3<m:1> is configured to perform AND logic operations on m first control signals CH_A<m:1> and a sampling phase signal PHS to output m clock control signals CLK<m:1>. First input terminals of the bootstrapped circuits <m:1> are coupled to the m clock control signals CLK<m:1> and second input terminals of the bootstrapped circuits <m:1> are coupled to the m analog input signals VIN<m:1>. The bootstrapped circuits <m:1> are configured to output m first switch control signals SW<m:1>.

In further embodiments, the third AND logic circuit AND3<m:1> performs AND logic operations on the m first control signals CH_A<m:1> and the sampling phase signal PHS to output the m clock control signals CLK<m:1>. For channel i, if CH_A<i>=1 and PHS=1, then CLK<i>=1; otherwise, CLK<i>=0. The third AND logic circuit AND3<m:1> may adopt any suitable circuit design. One of the simplest implementations is to construct it from m two-input AND gates. It receives the m first control signals CH_A<m:1> and PHS as inputs and generates the clock control signals CLK<m:1>=CH_A<m:1>*PHS. The bootstrapped circuits <m:1> are m bootstrapped circuits <1> to <m> corresponding to the e NMOS switches M1<1> to M1<m>. In further embodiments, it can be considered that the bootstrapped circuits <1> to <m> and the NMOS switches M1<1> to M1<m> make up m bootstrap switches <m:1>. The analog input signals VIN<m:1> are fed to the bootstrapped circuits <1> to <m> as input signals and CLK<m:1> as clock signals. In response, the bootstrapped circuits <1> to <m> output the first switch control signals SW<m:1>. The bootstrapped circuits <1> to <m> are also provided with a power supply VDD and a ground VSS. The bootstrapped circuits <1> to <m> output the m first switch control signals SW<m:1> under the control of the m clock control signals CLK<m:1>. Specifically, when one of the clock control signals CLK<m:1> is low, a corresponding one of the first switch control signals SW<m:1> is low. Moreover, when one of the clock control signal CLK<m:1> is high, the corresponding one of the first switch control signal SW<m:1> is higher than a corresponding one of the analog input signals VIN<m:1> by the power supply voltage VDD. For example, for channel i (i is any of 1 to m), the bootstrapped circuit <i> and the NMOS switch M1<i> make up the bootstrap switch <i>. The bootstrapped circuit <i> outputs the first switch control signal SW<i> under the control of the clock control signal CLK<i>. When CLK<i> is low, SW<i> is the ground voltage. When CLK<i> is high, SW<i> is VIN<i> plus the power supply voltage VDD.

Figure 18:
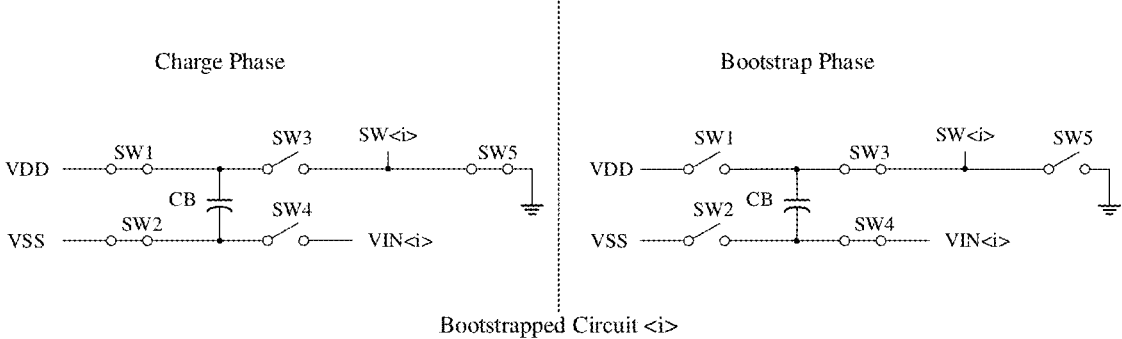
FIG. 18 is a schematic illustration of a bootstrapped circuit <i> according to an embodiment of the present invention.

In further embodiments, the bootstrapped circuits <1> to <m> may employ any suitable circuit design. Generally, each bootstrapped circuit includes a bootstrap capacitor. FIG. 18 is a schematic illustration of the bootstrapped circuit <i> according to an implementation of the present invention. As shown in FIG. 18, the bootstrapped circuit <i> is characterized in that, for example, for channel i, when the clock signal CLK<i> is low (in a charge phase as shown in FIG. 18), a bottom plate of the bootstrap capacitor CB in the bootstrapped circuit <i> is coupled to the ground VSS and a top plate thereof to the power supply voltage VDD. As a result, the bootstrap capacitor CB is charged, and the first switch control signal SW<i> output from the bootstrapped circuit <i> is low (i.e., VSS). Accordingly, the NMOS switch M1<i> in the MOS switch channel circuit 102 is OFF. When CLK<i> is high (i.e., VDD) (in a bootstrapped phase as shown in FIG. 18), the bottom plate of the bootstrap capacitor CB in the bootstrapped circuit <i> is coupled to the analog input signal VIN<i> and the top plate to an output terminal of the bootstrapped circuit <i>. As a result, the first switch control signal SW<i> output from the bootstrapped circuit <i> varies with the analog input signal VIN<i>. If load capacitance and parasitic capacitance of the bootstrapped circuit <i> are ignored, then according to the law of charge conservation, the first switch control signal SW<i> will be always higher than the analog input signal VIN<i> by the power supply voltage VDD. That is, SW<i>=VIN<i>+VDD.

When the MOS switch M1<i> is turned on, its on-resistance Ron is:

$$R_{on} = \frac{1}{\mu C_{ox}\left(\dfrac{W}{L}\right)(V_{gs} - V_{th})},$$

where μ is the mobility of carriers in a conducting channel in a MOS transistor of the MOS switch (in case of a NMOS transistor, the carriers are electrons and the mobility is denoted as $\mu_n$; and in case of a PMOS transistor, the carriers are holes and the mobility is denoted as $\mu_p$), Cox is capacitance density of an oxide layer in a gate of the MOS transistor, W and L are a width and a length of the gate, respectively, and Vgs is a gate-source voltage thereof.

In Embodiment 2, since the bootstrapped circuit <i> enables the gate voltage of the MOS switch M1<i> to be: SW<i>=VIN<i>+VDD, higher than its source voltage VIN<i> by the power supply voltage VDD, the gate-source voltage Vgs=SW<i>–VIN<i>=VDD. Accordingly, the above formula is simplified as:

$$R_{on} = \frac{1}{\mu_n C_{ox}\left(\dfrac{W}{L}\right)_N (VDD - V_{th})}.$$

As noted above, a threshold voltage Vth of the MOS switch can be expressed as:

$$V_{th} = V_{th0} + \gamma\left[\sqrt{|2\phi_F| + V_{BS}} - \sqrt{|2\phi_F|}\right].$$

When channel i is selected during an ADC sampling phase, the control generation circuit 100*a* outputs CH_A<i>=1 and CH_B<i>=0, and the non-overlapping clock circuit 110 outputs PHS=1 and PHC=0. Moreover, SW<i>=1, SW_C<i>=0, and M2<i> and M3<i> are both OFF. Under the control of SW<i>, Switch1<i> is turned on, and VB<i>=VIN<i>. Since the source voltage VS<i> of the MOS switch M1<i> is equal to VIN<i>, VBS=VB<i>–VS<i>=0 in the above formula, achieving the elimination of the body-bias effect. That is, Vth=Vth0 in the above formula. As a result of eliminating the body-bias effect, the expression of the on-resistance Ron of the switch <i> in channel i can be additionally simplified as:

$$R_{on} = \frac{1}{\mu_n C_{ox}\left(\dfrac{W}{L}\right)_N (VDD - V_{tho})}.$$

As can be seen, the MOS switch <i> in channel i is activated (i.e., turned on) only when it is selected during an ADC sampling phase (PHS=1 and PHC=0). Moreover, during the ADC sampling phase, the on-resistance Ron of the switch <i> in the selected channel i is constant and is not related to the input signal VIN<i>, resulting in a great increase in linearity of channel i. Further, the switch <i> in channel i remains OFF (or turned off or deactivated) in any other state, avoiding leakage and reducing power consumption.

It would be appreciated that the bootstrapped circuits <m:1> of Embodiment 2 may employ any suitable circuit design known in the art.

Figure 8A:
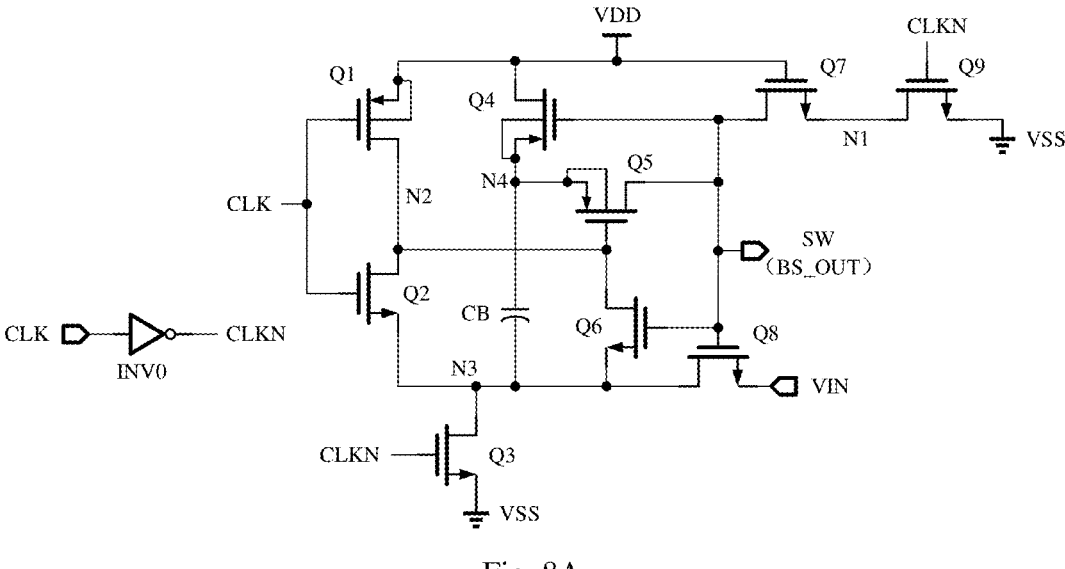
FIGS. 8A and 8B are schematic diagrams showing two exemplary structures of a bootstrapped circuit according to the second embodiment of the present invention.

As an exemplary embodiment, referring to FIG. 8A, in a design suitable for use in Embodiment 2, the bootstrapped circuit includes 9 MOS transistors Q1 to Q9, one inverter INV0 and one bootstrap capacitor CB. In the figure, CLK represents one of the clock control signals CLK<m:1> input to the bootstrapped circuit; VIN, represents one of the analog input signals VIN<m:1> input to the bootstrapped circuit; BS_OUT, represents an output terminal of the bootstrapped circuit, from which the corresponding first switch control signal SW is output; VDD, represents the power supply voltage (i.e., the high level); and VSS, represents the ground (i.e., the low level). The components in the circuit are wired in the following manner. CLK is coupled to a gate of Q1, a gate of Q2 and an input terminal of the inverter INV0. A drain of Q1, a drain of Q2, a gate of Q5 and a drain of Q6 are all coupled to a node N2. The power supply voltage VDD is coupled to a source and a substrate of Q1, a drain of Q4 and a gate of Q7. A source and a substrate of Q4, a source and a substrate of Q5 and a top plate (or upper plate) of the bootstrap capacitor CB are all coupled to a node N4. A gate of Q4, a drain of Q5, a gate of Q6, a drain of Q7 and a gate of Q8 are coupled together to form the output terminal BS_OUT of the bootstrapped circuit, from which the first switch control signal SW is output. A source of Q7 and a drain of Q9 are coupled to a node N1, and gates of Q9 and Q3 are both coupled to an output terminal of the inverter INV0 for receiving an inverted signal CLKN of CLK. A drain of Q3, a source of Q2, a source of Q6, a drain of Q8 and a bottom plate (or lower plate) of the bootstrap capacitor CB are all coupled to a node N3. A source of Q8 is coupled to the analog input signal VIN, and sources of Q3 and Q9 are both coupled to the ground VSS.

When the clock control signal CLK is low, CLKN output from the inverter INV0 is high, turning on Q3 and Q9 and thereby pulling the nodes N1 and N3 to low level. Under the action of CLK, Q1 is turned on and Q2 is turned off, pulling the node N2 to high level. As a result, Q5 is turned off and Q7 and Q9 are turned on, pulling SW output from BS_OUT to low level. Thus, Q4 is turned on and Q6 and Q8 are turned off, causing the power supply VDD to charge the bootstrap capacitor CB to VDD.

When the clock control signal CLK is high, CLKN output from the inverter INV0 is low, turning off Q3 and Q9. Under the action of CLK, Q1 is turned off and Q2 is turned on, pulling the node N2 down to the same voltage as the node N3. As a result, Q5 is turned on and the bootstrap capacitor CB charges terminal BS_OUT via the gates of Q6 and Q8, thus turning Q6 and Q8 on. Once activated, Q8 pulls the voltage at the node N3 to the same level as VIN, and Q6 pulls the voltage at the node N2 also to the same level as VIN. According to the law of charge conservation, a voltage at the node N4 varies with that at the node N3 to VIN+VDD. In this process, Q5 remains ON. Thus, SW at the output terminal BS_OUT of the bootstrapped circuit is equal to VIN+VDD. It is noted that, when ignoring load capacitance of the output terminal BS_OUT and parasitic capacitance of the top plate of the bootstrap capacitor CB, SW output from the output terminal BS_OUT is equal to VIN+VDD. However, in practice, SW output from the output terminal BS_OUT is slightly lower than VIN+VDD (depending on a relationship among the load capacitance, the parasitic capacitance and the capacitance of the bootstrap capacitor).

Figures 8B, 9:
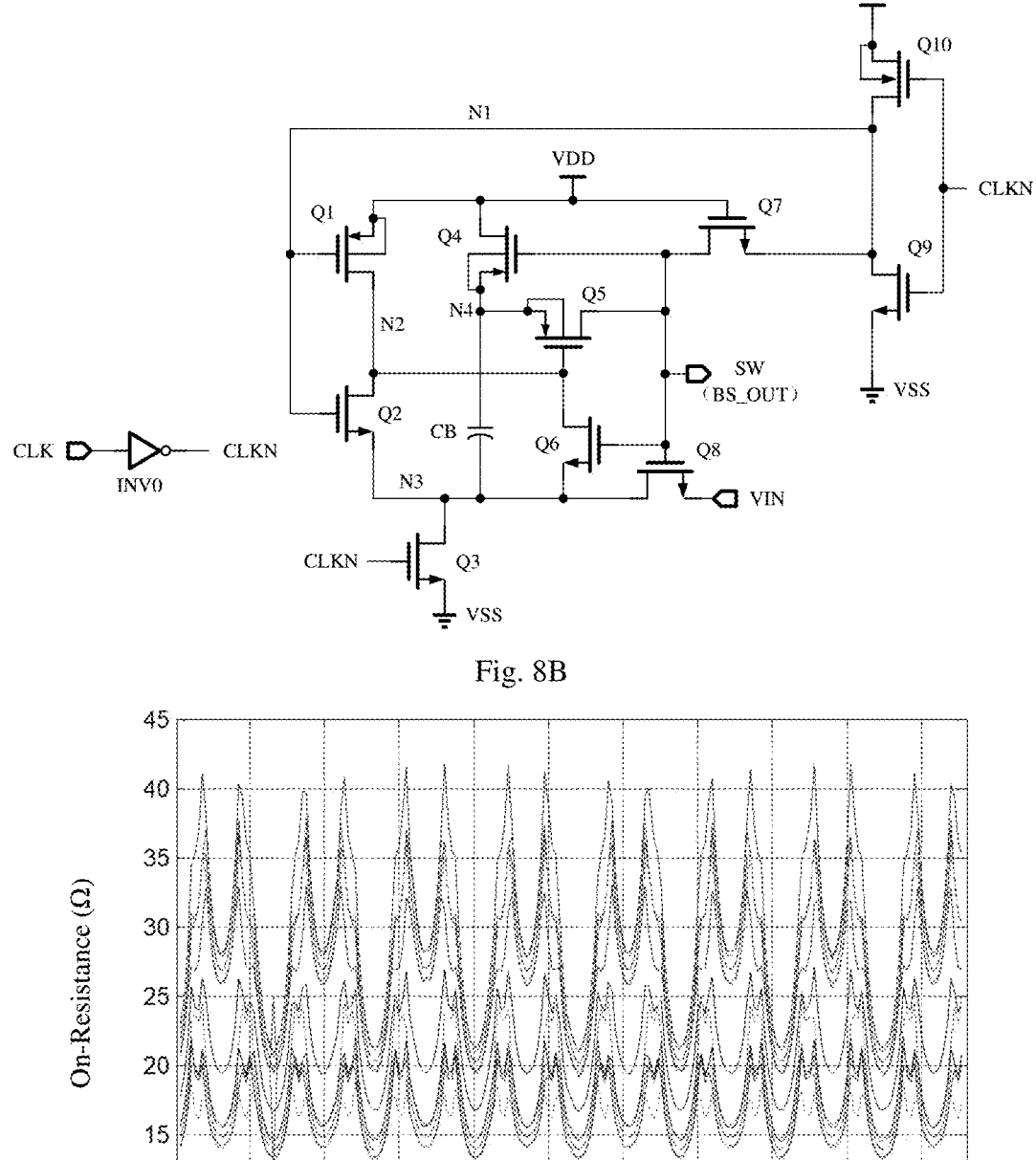
FIG. 9 schematically illustrates variation of on-resistance in the circuit of FIG. 2 with the number of sampling times at VDD=3.3V.

As another exemplary embodiment, referring to FIG. 8B, in an alternative design suitable for use in Embodiment 2, the bootstrapped circuit includes 10 MOS transistors Q1 to Q10, one inverter INV0 and one bootstrap capacitor CB. In the figure, CLK represents one of the clock control signals CLK<m:1> input to the bootstrapped circuit; VIN, represents one of the analog input signals VIN<m:1> input to the bootstrapped circuit; BS_OUT, represents an output terminal of the bootstrapped circuit, from which a corresponding first switch control signal SW is output; VDD, represents the power supply voltage (i.e., the high level); and VSS, represents the ground (i.e., the low level). The components in the bootstrapped circuit are wired in the following manner. CLK is coupled to an input terminal of the inverter INV0, and drains of Q1 and Q2, a gate of Q5 and a drain of Q6 are all coupled to a node N2. The power supply voltage VDD is coupled to a source and a substrate of Q1, a drain of Q4, a gate of Q7 and a source and a substrate of Q10. A source and a substrate of Q4, a source and a substrate of Q5 and a top plate (or upper plate) of the bootstrap capacitor CB are all coupled to a node N4. A gate of Q4, a drain of Q5, a gate of Q6, a drain of Q7 and a gate of Q8 are coupled together to form the output terminal BS_OUT of the bootstrapped circuit, from which the first switch control signal SW is output. A gate of Q9, a gate of Q2, a source of Q7, a drain of Q9 and a drain of Q10 are all coupled to a node N1, and gates of Q10, Q9 and Q3 are all coupled to an output terminal of the inverter INV0 for receiving an inverted signal CLKN of CLK. A drain of Q3, a source of Q2, a source of Q6, a drain of Q8 and a bottom plate (or lower plate) of the bootstrap capacitor CB are all coupled to a node N3. A source of Q8 is coupled to the analog input signal VIN, and sources of Q3 and Q9 are both coupled to the ground VSS.

When the clock signal CLK is low, CLKN output from the inverter INV0 is high, turning on Q3 and Q9 and turning off Q10. Thus, the nodes N1 and N3 are pulled to low level. Under the action of the node N1, Q1 is turned on and Q2 is turned off. Moreover, the node N2 is pulled to the high level, turning off Q5 and turning on Q7 and Q9. As a result, SW output from the output terminal BS_OUT is pulled to low level, turning on Q4 and turning off Q6 and Q8. Accordingly, the power supply VDD charges the bootstrap capacitor CB to VDD.

When the clock signal CLK is high, CLKN from the inverter INV0 is low, turning off Q3 and Q9 and turning on Q10. As a result, the node N1 is pulled to high level, turning off Q1 and turning on Q2. Moreover, the node N2 is pulled down to the same voltage as the node N3. Thus, Q5 is turned on and the bootstrap capacitor CB charges the output terminal BS_OUT via the gates of Q6 and Q8, turning Q6 and Q8 on. Once activated, Q8 pulls the voltage at the node N3 to the same level as VIN, and Q6 pulls the voltage at the node N2 also to the same level as VIN. According to the law of charge conservation, a voltage at the node N4 varies with that at the node N3 to VIN+VDD, concurrently with Q5 remaining ON. As a result, SW at the output terminal BS_OUT of the bootstrapped circuit is equal to VIN+VDD. It is noted that, when ignoring load capacitance of the output terminal BS_OUT and parasitic capacitance of the top plate of the bootstrap capacitor CB, SW from the output terminal BS_OUT is equal to VIN+VDD. However, in practice, SW output from the output terminal BS_OUT is slightly lower than VIN+VDD (depending on a relationship among the load capacitance, the parasitic capacitance and the capacitance of the bootstrap capacitor).

Operation of the channel selection circuit 10 in Embodiment 2 is explained in detail below.

For any channel i, if it is not selected, the control generation circuit 100a is configured to output CH_A<i>=0 and CH_B<i>=1, and the switch control circuit 100, the bootstrapped circuits and the substrate potential control circuit 101 are configured so that, no matter whether ADC sampling takes place, CLK<i>=0, SW<i>=0 and SW_C<i>=0. Therefore, Switch1<i> and M2<i> in the substrate potential control circuit 101 are both OFF. In the case shown in FIG. 7A, CH_B<i>=1 controls the gate of M3<i> and turns on the switch M3, pulling the substrate voltage VB<i> of M1<i> in the MOS switch channel circuit 102 to the ground voltage VSS. Moreover, M1<i> is OFF as its Vgs=0. In the case shown in FIG. 7B, CH_B<i>=1 controls the gate of M4<i> so that gate SW_D<i>=1, pulling the substrate voltage VB<i> of M1<i> to the ground VSS.

When channel i is selected, the control generation circuit 100a is configured to output CH_A<i>=1 and CH_B<i>=0. If the ADC sampling phase signal is low (ADC_SAMP=0), the non-overlapping clock circuit 110 outputs PHS=0 and PHC=1. The switch control circuit 100, the bootstrapped circuits and the substrate potential control circuit 101 are configured so that CLK<i>=0, SW<i>=0 and SW_C<i>=1. In the case shown in FIG. 7A, both Switch1<i> and M3<i> are OFF, and SW_C<i> controls the gate of M3<i> and turns on the switch M3<i>, pulling the substrate voltage VB<i> of M1<i> to the ground VSS. At the same time, M1<i> is OFF as its Vgs=0.

When channel i is selected, the control generation circuit 100a is configured to output CH_A<i>=1 and CH_B<i>=0. If the ADC sampling phase signal is high (ADC_SAMP=1), the non-overlapping clock circuit 110 outputs PHS=1 and PHC=0. The switch control circuit 100, the bootstrapped circuits and the substrate potential control circuit 101 are configured so that CLK<i>=1, SW<i>=1 and SW_C<i>=0. In the case shown in FIG. 7A, both M2<i> and M3<i> are OFF. As CLK<i>=1 for channel i, the corresponding bootstrap switch <i> outputs SW<i>=VDD+VIN<i>, and SW<i> controls the gate of Switch1<i> and turns on the switch Switch1<i>. As a result, VB<i>=VIN<i>, eliminating the body-bias effect of the MOS switch M1<i> in the MOS switch channel circuit 102. That is, Vth of the NMOS switch M1<i> is equal to Vth0. SW<i> also controls the gate of the NMOS switch M1<i> in the channel so that its gate-source voltage Vgs=SW<i>–VIN<i>=VDD. As a result, the NMOS switch M1<i> in the channel is ON. As can be seen from the above analysis, as a result of eliminating the body-bias effect, the on-resistance Ron of the NMOS switch M1<i> in the channel is not related to the input signal VIN<i>.

In summary, the channel selection circuit of Embodiment 2 combines bootstrap switch and deep N-well processes with the sampling and conversion phases PHS, PHC in the ADC in a sensible way so that the NMOS switch in a selected channel is likewise allowed to be turned on during an ADC sampling and remain OFF otherwise. Moreover, throughout the ON period of the NMOS switch, the on-resistance of the selected channel remains constant, significantly improving linearity performance of the channel selection circuit and making it competitive in ADC applications requiring high accuracy and a low power supply voltage.

In order to better demonstrate the advantages of Embodiment 2, two channel selection circuits respectively of the design according to Embodiment 2 and the conventional design shown in FIG. 2 were manufactured in a FAB with 25OD33 MOS transistors at a 40 nm technical node and subjected to process, voltage, and temperature (PVT) corner simulations. An analog input signal provided to any selected channel was full-scale sine wave signal with a peak-to-peak voltage equal to VDD and fin=146 kHz. An on-resistance comparison was drawn between the two channel selection circuits.

Figure 10:
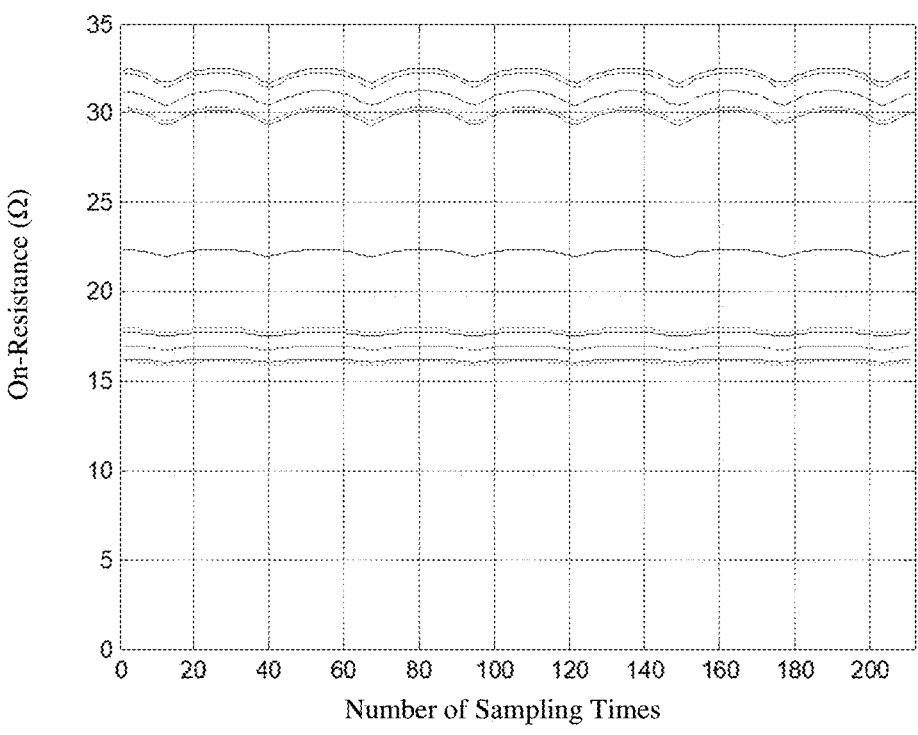
FIG. 10 schematically illustrates variation of on-resistance in the circuit of FIG. 6 with the number of sampling times at VDD=3.3V.

FIG. 9 shows variation of the on-resistance of the conventional design with the number of sampling times at VDD=3.3V, and FIG. 10 shows variation of the on-resistance of the design of Embodiment 2 with the number of sampling times at VDD=3.3V. Relevant information in FIGS. 9 to 10 is summarized in the table of FIG. 13. As can be apparently seen from a comparison made between FIGS. 5 and 6, as well as from the information in FIG. 13, at VDD=3.3V, the on-resistance of the conventional design varies significantly with the number of sampling times (i.e., with the analog input signal VIN)—at some process corners (SNFP 125), the difference between maximum and minimum on-resistance values (RON_max–RON_min) is roughly twice the minimum value. In contrast, the on-resistance of the design of Embodiment 2 varies minimally within 1Ω (substantially constant) with the number of sampling times.

Figure 11:
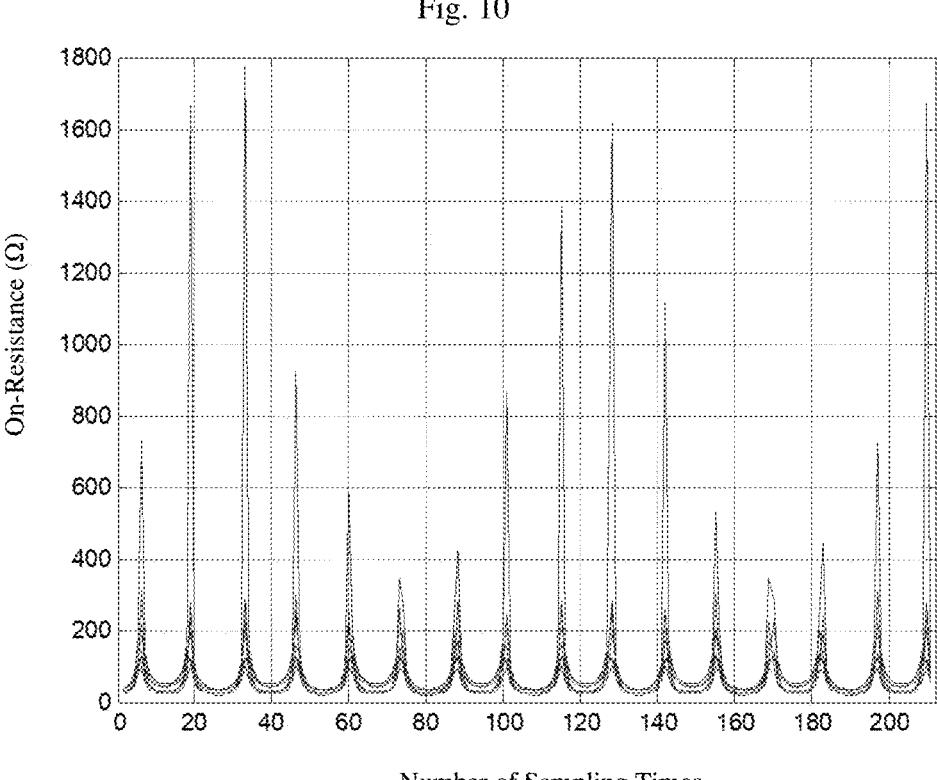
FIG. 11 schematically illustrates variation of on-resistance in the circuit of FIG. 2 with the number of sampling times at VDD=1.8V.
Figures 12, 13:
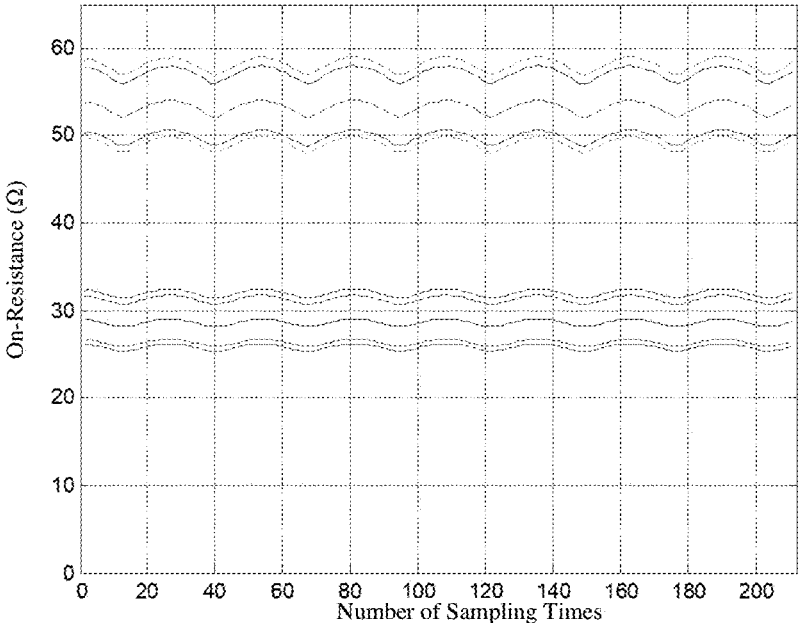
FIG. 12 schematically illustrates variation of on-resistance in the circuit of FIG. 6 with the number of sampling times at VDD=1.8V.
FIG. 13 shows a table summarizing relevant information in FIGS. 9 to 12 for comparative analysis.

FIG. 11 shows variation of the on-resistance of the conventional design with the number of sampling times at VDD=1.8V, and FIG. 12 shows variation of the on-resistance of the design of Embodiment 2 with the number of sampling times at VDD=1.8V. Relevant information in FIGS. 11 to 12 is summarized in the table of FIG. 13. As can be apparently seen from a comparison made between FIGS. 7 and 8, as well as from the information in FIG. 13, at VDD=1.8V, the on-resistance of the conventional design varies significantly with the number of sampling times—at some process corners, very poor turn-on performance is shown. In contrast, the on-resistance of the design of Embodiment 2 varies minimally within 2Ω (substantially constant) with the number of sampling times.

At even lower values of the power supply voltage VDD (e.g., at VDD=1.62V), the conventional design exhibits even worse on-resistance performance and may even fail to be turned on. In contrast, the proposed design can still provide excellent performance. In addition, since the design of Embodiment 2 has substantially constant on-resistance, its linearity performance is excellent and its harmonic distortion performance is greatly improved, enabling the ADC to provide the required high accuracy (e.g., a 16-bit or even higher resolution).

Based on the same inventive concept, referring to FIG. 6, Embodiment 2, an analog-to-digital converter (ADC) including an ADC circuit 11 and the channel selection circuit 10 as defined above is provided. The channel selection circuit 10 is coupled to m analog input signals VIN<m:1> and configured to select one of the m analog input signals VIN<m:1> each time and output it to an input terminal of the ADC circuit 11. The ADC circuit 11 is configured to convert the analog input signal selected by the channel selection circuit 10 to a digital signal Dout<N–1:0>.

Based on the same inventive concept, in Embodiment 2, a system-on-chip (SoC) including the ADC as defined above is provided.

Embodiment 3

Referring to FIG. 14, in a third embodiment, a channel selection circuit 10 and an analog-to-digital converter (ADC) including the channel selection circuit 10 and an ADC circuit 11 is provided. As a front-end circuit of the ADC circuit 11, the channel selection circuit 10 has a signal input terminal coupled to m analog input signals VIN<m:1> and a signal output terminal coupled to an input terminal of the ADC circuit 11. The channel selection circuit 10 selects one of the m analog input signals VIN<m:1> each time as an input ADC_Input to the ADC circuit 11 and outputs it to the input terminal of the ADC circuit 11. The ADC circuit 11 is configured to convert the analog input signal selected by the channel selection circuit 10 (i.e., ADC_Input) into a digital signal Dout<N–1:0>. In Embodiment 3, the channel selection circuit 10 also includes a switch control circuit 100, a substrate potential control circuit 101 and a MOS switch channel circuit 102.

In Embodiment 3, the switch control circuit 100 includes a control generation circuit 100a and a switch enabling circuit 100b. The control generation circuit 100a decodes and parses a k-bit channel selection signal SEL<k:1> and generates m pairs of first control signals CH_A<m:1> and second control signals CH_B<m:1> that are complementary to the first control signals.

The channel selection circuit 10 of Embodiment 3 differs from the channel selection circuit 10 of the Embodiment 1 particularly in that the MOS switch channel circuit 102 in the channel selection circuit 10 of Embodiment 3 utilizes m CMOS switches <m:1> to establish m channels, each consisting of an NMOS switch M1 and a PMOS switch M0 connected in parallel to the NMOS switch M1. That is, the m CMOS switches <m:1> comprise m NMOS switches M1<m:1> and m PMOS switches M0<m:1>. The switch enabling circuit 100b in the switch control circuit 100 generates, based on the first control signals CH_A<m:1> and PHS, pairs of mutually inverted switch control signals SW_N<m:1> and SW_P<m:1>. SW_N<m:1> represents first switch control signals for controlling gates of the NMOS switches M1<m:1> in the CMOS switches <m:1>, and SW_P<m:1> represents switch control signals for controlling gates of the PMOS switches M0<m:1> in the CMOS switches <m:1>. The substrate potential control circuit 101 generates, based on VIN<m:1>, SW_N<m:1>, SW_P<m:1>, CH_A<m:1>, CH_B<m:1> and PHC, VB_N<m:1> for controlling substrate voltages of the switches M1<m:1> and VB_P<m:1> for controlling substrate voltages of the switches M0<m:1>.

It would be appreciated that, Embodiment 3, the substrate potential control circuit 101 and the switch enabling circuit 100b may employ any suitable circuit designs.

Figure 15:
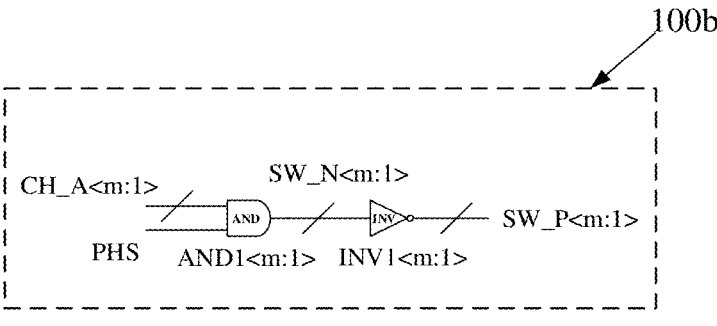
FIG. 15 is a schematic diagram showing two exemplary structures of a switch enabling circuit according to the third embodiment of the present invention.

As an exemplary embodiment, referring to FIG. 15, in Embodiment 3, the switch enabling circuit 100b includes a first AND logic circuit AND1<m:1> and m inverters INV1<m:1>. The first AND logic circuit AND1<m:1> receives CH_A<m:1> and PHS and outputs the first switch control signals SW_N<m:1> equivalent to SW<m:1> in the foregoing two embodiments. Input terminals of the m inverters INV1<m:1> are coupled to output terminals of first AND gates in the first AND logic circuit AND1<m:1>. The m inverters receive SW_N<m:1> and output inverted signals SW_P<m:1>.

Figure 16A:
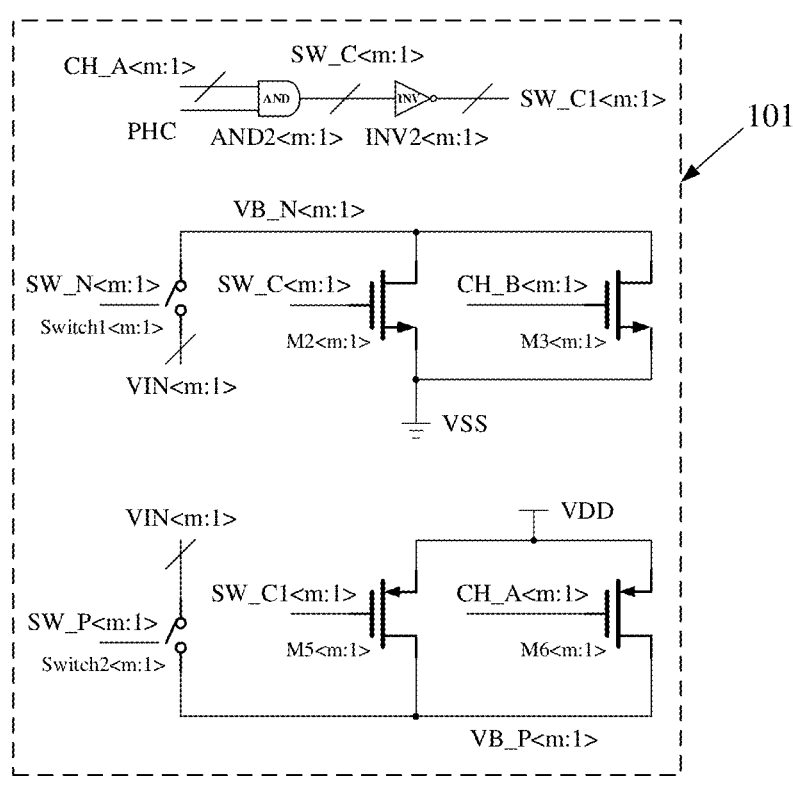
FIGS. 16A and 16B are schematic diagrams showing two exemplary structures of a substrate potential control circuit according to the third embodiment of the present invention.

As an exemplary embodiment, referring to FIG. 16A, the substrate potential control circuit 101 includes a second AND logic circuit AND2<m:1>, m inverters INV2<m:1>, first switch circuits Switch1<m:1>, second switch circuits M2<m:1>, third switch circuits M3<m:1>, fifth switch circuits M5<m:1>, sixth switch circuits M6<m:1> and ninth switch circuits Switch2<m:1>.

The second AND logic circuit AND2<m:1> receives CH_A<m:1> and PHC, and outputs second switch control signals SW_C<m:1>. Input terminals of the m inverters INV2<m:1> are coupled to output terminals of second AND gates in the second AND logic circuit AND2<m:1>. The m inverters receive SW_C<m:1> and output inverted signals SW_C1<m:1>.

Control terminals of the first switch circuits Switch1<m:1> are coupled to SW_N<m:1>, input terminals of the first switch circuits Switch1<m:1> to the analog input signals VIN<m:1> and output terminals of the first switch circuits Switch1<m:1> to output terminals of the second switch circuits M2<m:1> and the third switch circuits M3<m:1>. With this arrangement, VB_N<m:1> can be output to substrates of the NMOS switches M1<m:1>. Input terminals (e.g., sources) of the second switch circuits M2<m:1> and input terminals of the third switch circuits M3<m:1> are both grounded to VSS. Control terminals of the second switch circuits M2<m:1> are coupled to SW_C<m:1>, and control terminals of the third switch circuits M3<m:1> are coupled to CH_B<m:1>. In this way, the first switch circuits Switch1<m:1>, the second switch circuits M2<m:1> and the third switch circuits M3<m:1> constitute substrate potential control branches for controlling substrate voltages of the NMOS switches M1<m:1> in the CMOS switches, which function such that when, and only when, channel i in the MOS switch channel circuit 102 is selected (i.e., CH_A<i>=1 and CH_B<i>=0) during a sampling phase (i.e., PHS=1 and PHC=0), the substrate voltage VB_N<i> of M1<i> is coupled to the corresponding analog input signal VIN<i> and that it is coupled to the ground VSS in any other condition. They function in the same way as shown in FIGS. 5A and 7A and, therefore, need not be described in further detail herein.

Similarly, control terminals of the ninth switch circuits Switch2<m:1> are coupled to SW_P<m:1>, input terminals of the ninth switch circuits Switch2<m:1> are coupled to the analog input signals VIN<m:1> and output terminals of the ninth switch circuits Switch2<m:1> are coupled to output terminals of the fifth switch circuits M5<m:1> and output terminals of the sixth switch circuits M6<m:1>. With this arrangement, VB_P<m:1> can be output to substrates of the PMOS switches M0<m:1>. Input terminals (e.g., sources) of the fifth switch circuits M5<m:1> and input terminals of the sixth switch circuits M6<m:1> are both coupled to VDD. Control terminals of the fifth switch circuits M5<m:1> are coupled to SW_C1<m:1>, and control terminals of the sixth switch circuits M6<m:1> are coupled to CH_A<m:1>. In this way, the ninth switch circuits Switch2<m:1>, the fifth switch circuits M5<m:1> and the sixth switch circuits M6<m:1> constitute substrate potential control branches for controlling substrate voltages of the PMOS switches M0<m:1> in the CMOS switches, which function such that when, and only when, channel i in the MOS switch channel circuit 102 is selected (i.e., CH_A<i>=1 and CH_B<i>=0) during a sampling phase (i.e., PHS=1 and PHC=0), the substrate voltage VB_P<i> of M0<i> is coupled to the corresponding analog input signal VIN<i> and that it is coupled to VDD in any other condition.

Figure 16B:
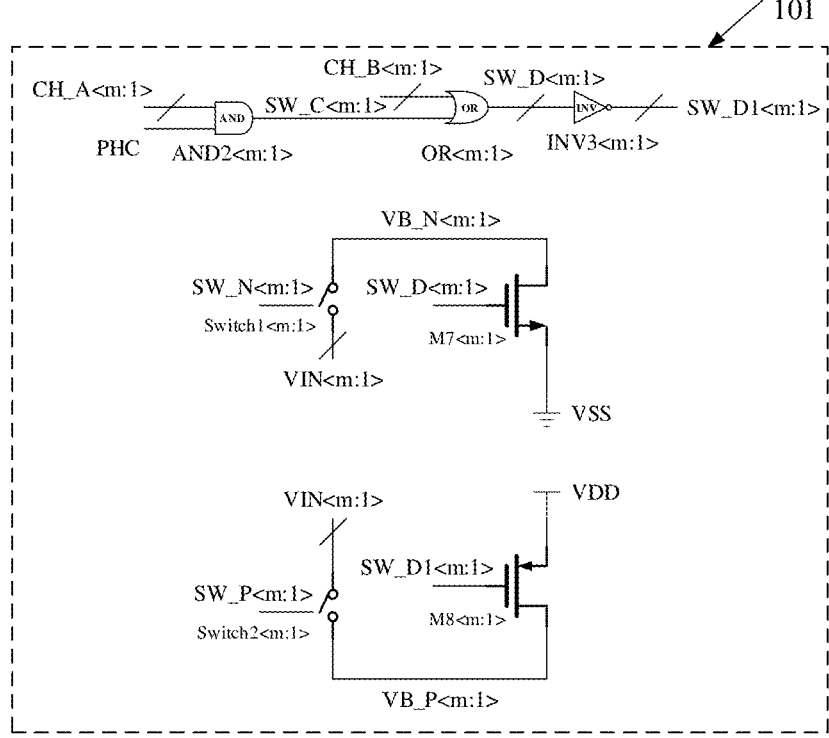

As another exemplary embodiment, referring to FIG. 16B, the substrate potential control circuit 101 includes a second AND logic circuit AND2<m:1>, an OR logic circuit OR<m:1>, m inverters INV3<m:1>, first switch circuits Switch1<m:1>, seventh switch circuits M7<m:1>, eighth switch circuits M8<m:1> and ninth switch circuits Switch2<m:1>.

The second AND logic circuit AND2<m:1> receives CH_A<m:1> and PHC, and outputs second switch control signals SW_C<m:1>. The OR logic circuit OR<m:1> receives SW_C<m:1> and CH_B<m:1>, and outputs third switch control signals SW_D<m:1>. Input terminals of the m inverters INV3<m:1> are coupled to output terminals of OR gates in the OR logic circuit OR<m:1>. The m inverters receive SW_D<m:1> and output inverted signals SW_D1<m:1>.

Control terminals of the first switch circuits Switch1<m:1> are coupled to SW_N<m:1>, input terminals of the first switch circuits Switch1<m:1> are coupled to the analog input signals VIN<m:1> and output terminals of the first switch circuits Switch1<m:1> are coupled to output terminals of the seventh switch circuits M7<m:1>. With this arrangement, VB_N<m:1> can be output to the substrates of the NMOS switches M1<m:1> in the CMOS switches. Input terminals (e.g., sources) of the seventh switch circuits M7<m:1> are grounded to VSS, and control terminals of the seventh switch circuits M7<m:1> are coupled to SW_D<m:1>. In this way, the first switch circuits Switch1<m:1> and the seventh switch circuits M7<m:1> constitute substrate potential control branches for controlling the substrate voltages of the NMOS switches M1<m:1> in the CMOS switches, which function such that when, and only when, channel i in the MOS switch channel circuit 102 is selected (i.e., CH_A<i>=1 and CH_B<i>=0) during a sampling phase (i.e., PHS=1 and PHC=0), the substrate voltage VB_N<i> of M1<i> is coupled to the corresponding analog input signal VIN<i> and that it is coupled to the ground VSS in any other condition. They function in the same way as shown in FIGS. 5B and 7B and, therefore, need not be described in further detail herein.

Similarly, control terminals of the ninth switch circuits Switch2<m:1> are coupled to SW_P<m:1>, input terminals of the ninth switch circuits Switch2<m:1> are coupled to the analog input signals VIN<m:1> and output terminals of the ninth switch circuits Switch2<m:1> are coupled to output terminals of the eighth switch circuits M8<m:1>. With this arrangement, VB_P<m:1> can be output to the substrates of the PMOS switches M0<m:1> in the CMOS switches. Input terminals (e.g., sources) of the eighth switch circuits M8<m:1> are coupled to VDD, and control terminals of the eighth switch circuits M8<m:1> are coupled to SW_D1<m:1>. In this way, the ninth switch circuits Switch2<m:1> and the eighth switch circuits M8<m:1> constitute substrate potential control branches for controlling substrate voltages of the PMOS switches M0<m:1> in the CMOS switches, which function such that when, and only when, channel i in the MOS switch channel circuit 102 is selected (i.e., CH_A<i>=1 and CH_B<i>=0) during a sampling phase (i.e., PHS=1 and PHC=0), the substrate voltage VB_P<i> of M0<i> is coupled to the analog input signal VIN<i> and that it is coupled to VDD in any other condition.

It would be appreciated that although the CMOS switches in Embodiment 3 may be fabricated using a P-substrate (i.e., entirely on a P-substrate), in other implementations, they may also be fabricated using a deep N-well (DNW) process. A DNW is an N-well located under a MOS transistor and above a P-substrate, which can work together with conventional N-wells to make a substrate of an overlying NMOS transistor independent of the P-substrate. Fabricating the NMOS transistors M1<i> with such DNWs allows independent control of their substrate voltages VB_N. Further, as the PMOS transistors M0<i> can be fabricated in individual N-wells, their substrate voltages VB_P can also be independently controlled.

Additionally, it is noted that, in Embodiment 3, in case of the MOS switches (i.e., <1> to <m>) in the MOS switch channel circuit 102 being implemented as CMOS switches, since the input signals VIN swing from 0 to VDD, the first switch circuits Switch1<m:1> and the ninth switch circuits Switch2<m:1> may also be implemented as CMOS switches.

In summary, like the channel selection circuit 10 of Embodiment 1, only when channel i is selected by the k-bit channel selection signal SEL<k:1> during an ADC sampling phase (PHS=1 and PHC=0), the channel selection circuit 10 of Embodiment 3 will turn on the corresponding CMOS switch (the PMOS transistor M0<i> and the NMOS transistor M1<i>). Otherwise, the CMOS switch (the PMOS transistor M0<i> and the NMOS transistor M1<i>) remains OFF. Once the CMOS switch is activated, the substrate VB_P<i> of the PMOS transistor M0<i> and the substrate VB_N<i> of the NMOS transistor M1<i> are both coupled to the input VIN<i>, thereby eliminating the body-bias effect of M0<i> and M1<i>. When the CMOS switch is turned off, the substrate VB_P<i> of the PMOS transistor M0<i> is coupled to the power supply voltage VDD, and the substrate VB_N<i> of the NMOS transistor M1<i> is grounded to VSS.

When channel i is selected and the ADC sampling phase signal is high (ADC_SAMP=1), the control generation circuit 100$a$ outputs CH_A<i>=1 and CH_B<i>=0, and the non-overlapping clock circuit 110 outputs PHS=1 and PHC=0. Since CH_A<i>=1 and PHS=1, the switch control circuit 100 outputs SW_N<i>=1 and SW_P<i>=0. Accordingly, the PMOS switch M0<i> and the NMOS switch M1<i> of the CMOS switch in channel i are both turned on.

Since SW_N<i>=1, SW_P<i>=0, CH_A<i>=1, CH_B<i>=0 and PHC=0, VB_N<i> and VB_P<i> output from the substrate potential control circuit 101 couple the substrates of the NMOS transistor M1<i> and the PMOS transistor M0<i> to the input VIN<i> for channel i, thus eliminating the body-bias effect of M0<i> ⊣ M1<i>. That is, Vthn=Vthn0 for the NMOS switch M1<i>, and Vthp=Vthp0 for the PMOS switch M0<i>.

Accordingly, the on-resistance Ron of the activated CMOS switch (M0<i> and M1<i>) is the paralleled on-resistances of the of NMOS switch M1<i> and PMOS switch M0<i> and is given by:

$$R_{on} = \cfrac{1}{\mu_n C_{ox}\left(\dfrac{W}{L}\right)_N (VDD - V_{thn0}) - \mu_p C_{ox}\left(\dfrac{W}{L}\right)_P |V_{thp0}| - \left[\mu_n C_{ox}\left(\dfrac{W}{L}\right)_N - \mu_p C_{ox}\left(\dfrac{W}{L}\right)_P\right] V_{in}}.$$

As can be seen, theoretically, when $$\mu_n C_{ox}\left(\frac{W}{L}\right)_N = \mu_p C_{ox}\left(\frac{W}{L}\right)_P,$$

the on-resistance Ron of the CMOS switch is not related to the input signal VIN and is constant. Therefore, in this case, the CMOS switch will have the best linearity.

In Embodiment 3, the channel selection circuit likewise allows the NMOS switch in a selected channel to be turned on during an ADC sampling and remain OFF otherwise. Moreover, throughout the ON period of the CMOS switch in the selected channel, the substrate of the CMOS switch is maintained at the same voltage as the corresponding analog input signal coupled to the channel. This eliminates the body-bias effect of the CMOS switch and enables its on-resistance to remain constant, thereby greatly enhancing linearity performance of the channel selection circuit and makes it competitive in ADC applications requiring high accuracy and a low power supply voltage.

Based on the same inventive concept, referring to FIG. 14, in Embodiment 3, an analog-to-digital converter (ADC) including an ADC circuit 11 and the channel selection circuit 10 as defined above is provided. The channel selection circuit 10 is coupled to m analog input signals VIN<m:1> and configured to select one of the m analog input signals VIN<m:1> each time and output it to an input terminal of the ADC circuit 11. The ADC circuit 11 is configured to convert the analog input signal selected by the channel selection circuit 10 to a digital signal Dout<N−1:0>.

Based on the same inventive concept, Embodiment 3, referring to FIG. 14, a system-on-chip (SoC) including the ADC as defined above is provided.

Optionally, the MOS switch in each channel may be a CMOS switch or an NMOS switch formed by a deep N-well process.

Optionally, the substrate potential control circuit may be further configured to:

during a conversion phase and the sampling phase of the ADC circuit, pull substrate voltages of the NMOS switches in the unselected channels to a ground; or during the conversion and sampling phases of the ADC circuit, pull substrate voltages of NMOS switches in the CMOS switches in the unselected channels to the ground and pull substrate voltages of PMOS switches in the CMOS switches to a power supply voltage.

Optionally, the substrate potential control circuit may be further configured to:

during the sampling phase of the ADC circuit, connect the substrate voltage of the NMOS switch in the selected channel to the analog input signal to which the selected channel is coupled and, during a conversion phase of the ADC circuit, pull the substrate voltage of the NMOS switch in the selected channel to a ground; or during the sampling phase of the ADC circuit, connect substrate voltages of NMOS and PMOS switches in the CMOS switch in the selected channel to the analog input signal to which the selected channel is coupled and, during the conversion phase of the ADC circuit, pull the substrate voltage of the NMOS switch in the CMOS switch in the selected channel to the ground and the substrate voltage of the PMOS switch in the CMOS switch in the selected channel to a power supply voltage.

Optionally, the switch control circuit may comprise:

a control generation circuit comprising an input terminal coupled to a channel selection signal which is a k-bit signal, wherein the control generation circuit is configured to generate m first control signals and m second control signals that are complementary to the m first control signals based on the channel selection signal;

a switch enabling circuit comprising a first input terminal coupled to an output terminal of the control generation circuit and a second input terminal coupled to a sampling phase signal of the ADC circuit, wherein the switch enabling circuit is configured to generate, based on the m first control signals and the sampling phase signal, the m first switch control signals to the substrate potential control circuit.

Optionally, the switch enabling circuit may comprise a first AND logic circuit configured to perform AND logic operations on the m first control signals and the sampling phase signal and thereby output the m first switch control signals.

Optionally, the switch enabling circuit may comprise a third AND logic circuit and bootstrapped circuits, wherein the third AND logic circuit is configured to perform AND logic operations on the m first control signals and the sampling phase signal, and thereby output the m clock control signals, wherein each bootstrapped circuit comprises a first input terminal coupled to a corresponding clock control signal, and a second input terminal coupled to a corresponding analog input signal, and wherein each bootstrapped circuit is configured to output a corresponding first switch control signal.

Optionally, the substrate potential control circuit may comprise:

a first switch circuit comprising: control terminals coupled to the m first switch control signals; input terminals coupled to the m analog input signals; and output terminals serving as the output terminals of the substrate potential control circuit, wherein the first switch circuit is configured to, under control of the first switch control signals, output the m analog input signals as m substrate voltage signals and provide the m substrate voltage signals to the substrates of m MOS switches in the channels of the MOS switch channel circuit.

Optionally, the substrate potential control circuit may further comprise:

a second AND logic circuit configured to perform AND logic operations on the m first control signals and a conversion phase signal of the ADC circuit, and thereby output m second switch control signals, wherein the conversion phase signal and the sampling phase signal form two-phase non-overlapping clock signals;

second switch circuits comprising: control terminals coupled to the m second switch control signals; input terminals coupled to the ground or the power supply voltage; and output terminals coupled to the output terminals of the substrate potential control circuit, wherein the second switch circuits configured to, under control of the m second switch control signals, pull voltages at the output terminals of the substrate potential control circuit to the ground or the power supply voltage; and third switch circuits comprising: control terminals coupled to the m second control signals; input terminals coupled to the ground or the power supply voltage and; and output terminals coupled to the output terminals of the substrate potential control circuit, wherein the third switch circuits configured to, under the control of the m second switch control signals, pull the voltages at the output terminals of the substrate potential control circuit to the ground or the power supply voltage.

Optionally, in case of the MOS switches being implemented as the CMOS switches, the second or third switch circuit pulls the output terminals of the substrate potential control circuit coupled to substrates of the NMOS switches in the CMOS switches to the ground, and pulls the output terminals of the substrate potential control circuit coupled to substrates of the PMOS switches in the CMOS switches to the power supply voltage; in case of the MOS switches being implemented as the NMOS switches, the second or third switch circuit pulls the output terminals of the substrate potential control circuit that are coupled to substrates of the NMOS switches to the ground.

Optionally, the substrate potential control circuit may further comprise:

a second AND logic circuit for configured to perform AND logic operations on the m second control signals and a conversion phase signal of the ADC circuit, and thereby output m second switch control signals, wherein a conversion phase signal and the sampling phase signal form two-phase non-overlapping clock signals;

an OR logic circuit comprising: first input terminals coupled to the m second control signals; and second input terminals coupled to the m second switch control signals, wherein the OR logic circuit is configured to perform OR logic operations on the m second control signal and the m second switch control signals; and fourth switch circuit comprising: control terminals coupled to the output terminals of the OR logic circuit; input terminals coupled to the ground or the power supply voltage; and output terminals coupled to the output terminals of the substrate potential control circuit, wherein the fourth switch circuit is configured to, under control of outputs from the OR logic circuit, pull voltages at the output terminals of the substrate potential control circuit to the ground or the power supply voltage.

Optionally, in case of the MOS switches being implemented as the CMOS switches, the fourth switch circuit is configured to: pull the output terminals of the substrate potential control circuit coupled to substrates of the NMOS switches in the CMOS switches to the ground, and pull the output terminals of the substrate potential control circuit coupled to substrates of the PMOS switches in the CMOS switches to the power supply voltage; in case of the MOS switches being implemented as the NMOS switches, the fourth switch circuit is configured to pull the output terminals of the substrate potential control circuit that are coupled to substrates of the NMOS switches to the ground.

Optionally, the switch enabling circuit may comprise a third AND logic circuit and bootstrapped circuits, wherein the third AND logic circuit is configured to perform AND logic operations on the m first control signals and the sampling phase signal, and thereby output m clock control signals, wherein the bootstrapped circuits comprise first input terminals coupled to output terminals of the third AND logic circuit and hence to the m clock control signals, wherein the bootstrapped circuits comprise second input terminals coupled to the m analog input signals, wherein the bootstrapped circuits comprise: output terminals coupled to the control terminals of the first switch circuits; power supply terminals coupled to the power supply voltage; and ground terminals coupled to the ground, wherein the bootstrapped circuits are configured to, under control of the m clock control signals, output the m first switch control signals, and wherein: the m first switch control signals are grounded when the clock control signals are low; or the m first switch control signals are higher than the analog input signals by a power supply voltage when the clock control signals are high.

Optionally, the bootstrapped circuits may comprise bootstrap capacitors, wherein when the clock control signal is low, the bootstrapped circuit is turned off, the first switch control signal output from the bootstrapped circuit is grounded, a lower plate of the bootstrap capacitor is grounded and an upper plate of the bootstrap capacitor is coupled to the power supply voltage and charged thereby, and wherein when the clock control signal is high, the bootstrapped circuit is turned on, the lower plate of the bootstrap capacitor is coupled to the analog input signal and the upper plate of the bootstrap capacitor is coupled to the output terminal of the bootstrapped circuit so that the first switch control signal output from the bootstrapped circuit varies with the analog input signal while being always higher than the analog input signal by the power supply voltage.

Optionally, the first AND logic circuit may comprise m first AND gates corresponding to the m channels.

Optionally, the second AND logic circuit may comprise m second AND gates corresponding to the m channels, and the second switch circuit, the third switch circuit or the fourth switch circuit may comprise m MOS switches respectively.

Optionally, the ADC circuit may comprise a non-overlapping clock circuit which generates the sampling signal and a conversion phase signal based on a single clock signal, wherein the sampling signal and the conversion phase signal form two-phase non-overlapping sampling signals.

The description presented above is merely that of some preferred embodiments of the present invention and is not intended to limit the scope thereof. Any and all changes and modifications made by those of ordinary skill in the art based on the above teachings fall within the scope as defined in the appended claims.

What is claimed is:

1. A channel selection circuit serving as a front-end circuit of an analog-to-digital conversion (ADC) circuit, wherein the channel selection circuit comprises:

a switch control circuit, configured to generate first switch control signals based on channel selection signals during a sampling phase of the ADC circuit;

a MOS switch channel circuit comprising an input terminal coupled to m analog input signals and an output terminal coupled to an input terminal of the ADC circuit, wherein the MOS switch channel circuit has m channels each having a MOS switch, wherein a gate of each MOS switch is coupled to a corresponding one of the first switch control signals; and a substrate potential control circuit comprising: input terminals coupled to the m analog input signals and the first switch control signals; and output terminals coupled to substrates of the MOS switches in the MOS switch channel circuit, wherein the substrate potential control circuit is configured to set, during the sampling phase of the ADC circuit, a substrate voltage of the MOS switch in a selected channel to a voltage of the analog input signal to which the selected channel is coupled.

2. The channel selection circuit of claim 1, wherein the MOS switch in each channel is a CMOS switch or an NMOS switch formed by a deep N-well process.

3. The channel selection circuit of claim 2, wherein the substrate potential control circuit is further configured to:

during a conversion phase and the sampling phase of the ADC circuit, pull substrate voltages of the NMOS switches in the unselected channels to a ground; or during the conversion and sampling phases of the ADC circuit, pull substrate voltages of NMOS switches in the CMOS switches in the unselected channels to the ground and pull substrate voltages of PMOS switches in the CMOS switches to a power supply voltage.

4. The channel selection circuit of claim 2, wherein the substrate potential control circuit is further configured to:

during the sampling phase of the ADC circuit, connect the substrate voltage of the NMOS switch in the selected channel to the analog input signal to which the selected channel is coupled and, during a conversion phase of the ADC circuit, pull the substrate voltage of the NMOS switch in the selected channel to a ground; or during the sampling phase of the ADC circuit, connect substrate voltages of NMOS and PMOS switches in the CMOS switch in the selected channel to the analog input signal to which the selected channel is coupled and, during the conversion phase of the ADC circuit, pull the substrate voltage of the NMOS switch in the CMOS switch in the selected channel to the ground and the substrate voltage of the PMOS switch in the CMOS switch in the selected channel to a power supply voltage.

5. The channel selection circuit of claim 1, wherein the switch control circuit further comprises:

a control generation circuit comprising an input terminal coupled to a channel selection signal which is a k-bit signal, wherein the control generation circuit is configured to generate m first control signals and m second control signals that are complementary to the m first control signals based on the channel selection signal;

a switch enabling circuit comprising a first input terminal coupled to an output terminal of the control generation circuit and a second input terminal coupled to a sampling phase signal of the ADC circuit, wherein the switch enabling circuit is configured to generate, based on the m first control signals and the sampling phase signal, the m first switch control signals to the substrate potential control circuit.

6. The channel selection circuit of claim 5, wherein: the switch enabling circuit comprises a first AND logic circuit configured to perform AND logic operations on the m first control signals and the sampling phase signal, and thereby output the m first switch control signals.

7. The channel selection circuit of claim 6, wherein the first AND logic circuit comprises m first AND gates corresponding to the m channels.

8. The channel selection circuit of claim 5, wherein:

the switch enabling circuit comprises a third AND logic circuit and bootstrapped circuits, wherein the third AND logic circuit is configured to perform AND logic operations on the m first control signals and the sampling phase signal, and thereby output the m clock control signals, wherein each bootstrapped circuit comprises a first input terminal coupled to a corresponding clock control signal, and a second input terminal coupled to a corresponding analog input signal, and wherein each bootstrapped circuit is configured to output a corresponding first switch control signal.

9. The channel selection circuit of claim 8, wherein the bootstrapped circuits comprise bootstrap capacitors, wherein when the clock control signal is low, the bootstrapped circuit is turned off, the first switch control signal output from the bootstrapped circuit is grounded, a lower plate of the bootstrap capacitor is grounded and an upper plate of the bootstrap capacitor is coupled to the power supply voltage and charged thereby, and wherein when the clock control signal is high, the bootstrapped circuit is turned on, the lower plate of the bootstrap capacitor is coupled to the analog input signal and the upper plate of the bootstrap capacitor is coupled to the output terminal of the bootstrapped circuit so that the first switch control signal output from the bootstrapped circuit varies with the analog input signal while being always higher than the analog input signal by the power supply voltage.

10. The channel selection circuit of claim 5, wherein the substrate potential control circuit comprises:

a first switch circuit comprising: control terminals coupled to the m first switch control signals; input terminals coupled to the m analog input signals; and output terminals serving as the output terminals of the substrate potential control circuit, wherein the first switch circuit is configured to, under control of the first switch control signals, output the m analog input signals as m substrate voltage signals and provide the m substrate voltage signals to the substrates of m MOS switches in the channels of the MOS switch channel circuit.

11. The channel selection circuit of claim 10, wherein the substrate potential control circuit further comprises:

a second AND logic circuit configured to perform AND logic operations on the m first control signals and a conversion phase signal of the ADC circuit, and thereby output m second switch control signals, wherein the conversion phase signal and the sampling phase signal form a pair of two-phase non-overlapping clock signals;

a second switch circuit comprising: control terminals coupled to the m second switch control signals; input terminals coupled to the ground or the power supply voltage; and output terminals coupled to the output terminals of the substrate potential control circuit, wherein the second switch circuit configured to, under control of the m second switch control signals, pull voltages at the output terminals of the substrate potential control circuit to the ground or the power supply voltage; and a third switch circuit comprising: control terminals coupled to the m second control signals; input terminals coupled to the ground or the power supply voltage and; and output terminals coupled to the output terminals of the substrate potential control circuit, wherein the third switch circuit configured to, under the control of the m second switch control signals, pull the voltages at the output terminals of the substrate potential control circuit to the ground or the power supply voltage.

12. The channel selection circuit of claim 11, wherein:

in case of the MOS switches being implemented as the CMOS switches, the second or third switch circuit pulls the output terminals of the substrate potential control circuit coupled to substrates of the NMOS switches in the CMOS switches to the ground, and pulls the output terminals of the substrate potential control circuit coupled to substrates of the PMOS switches in the CMOS switches to the power supply voltage;

in case of the MOS switches being implemented as the NMOS switches, the second or third switch circuit pulls the output terminals of the substrate potential control circuit that are coupled to substrates of the NMOS switches to the ground.

13. The channel selection circuit of claim 11, wherein the second AND logic circuit comprises m second AND gates corresponding to the m channels, and wherein the second switch circuit, the third switch circuit or the fourth switch circuit comprises m MOS switches respectively.

14. The channel selection circuit of claim 10, wherein the substrate potential control circuit further comprises:

a second AND logic circuit for configured to perform AND logic operations on the m second control signals and a conversion phase signal of the ADC circuit, and thereby output m second switch control signals, wherein a conversion phase signal and the sampling phase signal form a pair of two-phase non-overlapping clock signals;

an OR logic circuit comprising: first input terminals coupled to the m second control signals; and second input terminals coupled to the m second switch control signals, wherein the OR logic circuit is configured to perform OR logic operations on the m second control signal and the m second switch control signals; and fourth switch circuit comprising: control terminals coupled to the output terminals of the OR logic circuit; input terminals coupled to the ground or the power supply voltage; and output terminals coupled to the output terminals of the substrate potential control circuit, wherein the fourth switch circuit is configured to, under control of outputs from the OR logic circuit, pull voltages at the output terminals of the substrate potential control circuit to the ground or the power supply voltage.

15. The channel selection circuit of claim 14, wherein:

in case of the MOS switches being implemented as the CMOS switches, the fourth switch circuit is configured to: pull the output terminals of the substrate potential control circuit coupled to substrates of the NMOS switches in the CMOS switches to the ground, and pull the output terminals of the substrate potential control circuit coupled to substrates of the PMOS switches in the CMOS switches to the power supply voltage;

in case of the MOS switches being implemented as the NMOS switches, the fourth switch circuit is configured to pull the output terminals of the substrate potential control circuit that are coupled to substrates of the NMOS switches to the ground.

16. The channel selection circuit of claim 10, wherein the switch enabling circuit comprises a third AND logic circuit and bootstrapped circuits, wherein the third AND logic circuit is configured to perform AND logic operations on the m first control signals and the sampling phase signal, and thereby output m clock control signals, wherein the bootstrapped circuits comprise first input terminals coupled to output terminals of the third AND logic circuit and hence to the m clock control signals, wherein the bootstrapped circuits comprise second input terminals coupled to the m analog input signals, wherein the bootstrapped circuits comprise: output terminals coupled to the control terminals of the first switch circuits; power supply terminals coupled to the power supply voltage; and ground terminals coupled to the ground, wherein the bootstrapped circuits are configured to, under control of the m clock control signals, output the m first switch control signals, and wherein: the m first switch control signals are grounded when the clock control signals are low; or the m first switch control signals are higher than the analog input signals by a power supply voltage when the clock control signals are high.

17. The channel selection circuit of claim 16, wherein the bootstrapped circuits comprise bootstrap capacitors, wherein when the clock control signal is low, the bootstrapped circuit is turned off, the first switch control signal output from the bootstrapped circuit is grounded, a lower plate of the bootstrap capacitor is grounded and an upper plate of the bootstrap capacitor is coupled to the power supply voltage and charged thereby, and wherein when the clock control signal is high, the bootstrapped circuit is turned on, the lower plate of the bootstrap capacitor is coupled to the analog input signal and the upper plate of the bootstrap capacitor is coupled to the output terminal of the bootstrapped circuit so that the first switch control signal output from the bootstrapped circuit varies with the analog input signal while being always higher than the analog input signal by the power supply voltage.

18. The channel selection circuit of claim 5, wherein the ADC circuit comprises a non-overlapping clock circuit which generates the sampling signal and a conversion phase signal based on a single clock signal, wherein the sampling signal and the conversion phase signal form two-phase non-overlapping clock signals.

19. An analog-to-digital converter (ADC) comprising an analog-to-digital conversion (ADC) circuit and a channel selection circuit, wherein the channel selection circuit comprises:

a switch control circuit, configured to generate first switch control signals based on channel selection signals during a sampling phase of the ADC circuit;

a MOS switch channel circuit comprising an input terminal coupled to m analog input signals and an output terminal coupled to an input terminal of the ADC circuit, wherein the MOS switch channel circuit has m channels each having a MOS switch, wherein a gate of each MOS switch is coupled to a corresponding one of the first switch control signals; and a substrate potential control circuit comprising: input terminals coupled to the m analog input signals and the first switch control signals; and output terminals coupled to substrates of the MOS switches in the MOS switch channel circuit, wherein the substrate potential control circuit is configured to set, during the sampling phase of the ADC circuit, a substrate voltage of the MOS switch in a selected channel to a voltage of the analog input signal to which the selected channel is coupled, wherein the channel selection circuit is coupled to the m analog input signals and is configured to select one of the m analog input signals each time and output the selected analog input signal to an input terminal of the ADC circuit, and wherein the ADC circuit is configured to convert the analog input signal selected by the channel selection circuit into a digital signal.

20. A system-on-chip (SoC) comprising an analog-to-digital converter (ADC), wherein the ADC comprises an analog-to-digital conversion (ADC) circuit and a channel selection circuit, wherein the channel selection circuit comprises:

a switch control circuit, configured to generate first switch control signals based on channel selection signals during a sampling phase of the ADC circuit;

a MOS switch channel circuit comprising an input terminal coupled to m analog input signals and an output terminal coupled to an input terminal of the ADC circuit, wherein the MOS switch channel circuit has m channels each having a MOS switch, wherein a gate of each MOS switch is coupled to a corresponding one of the first switch control signals; and a substrate potential control circuit comprising: input terminals coupled to the m analog input signals and the first switch control signals; and output terminals coupled to substrates of the MOS switches in the MOS switch channel circuit, wherein the substrate potential control circuit is configured to set, during the sampling phase of the ADC circuit, a substrate voltage of the MOS switch in a selected channel to a voltage of the analog input signal to which the selected channel is coupled, wherein the channel selection circuit is coupled to the m analog input signals and is configured to select one of the m analog input signals each time and output the selected analog input signal to an input terminal of the ADC circuit, and wherein the ADC circuit is configured to convert the analog input signal selected by the channel selection circuit into a digital signal.

* * * * *